(12) United States Patent
Mimura

(10) Patent No.: US 8,264,122 B2
(45) Date of Patent: Sep. 11, 2012

(54) ACOUSTIC WAVE DEVICE

(75) Inventor: Masakazu Mimura, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 136 days.

(21) Appl. No.: 12/691,791

(22) Filed: Jan. 22, 2010

(65) Prior Publication Data
US 2010/0187947 A1    Jul. 29, 2010

(30) Foreign Application Priority Data

Jan. 26, 2009  (JP) ................................ 2009-014578
Dec. 3, 2009   (JP) ................................ 2009-275300

(51) Int. Cl.
*H01L 41/08* (2006.01)

(52) U.S. Cl. ................. 310/313 A; 310/313 R

(58) Field of Classification Search .......... 252/62.9 PZ; 310/358, 359, 313 A, 313 R
See application file for complete search history.

(56) References Cited

U.S. PATENT DOCUMENTS

| | | | |
|---|---|---|---|
| 6,025,636 A * | 2/2000 | Nakahata et al. ............. 257/416 |
| 6,400,061 B1 * | 6/2002 | Inoue et al. .............. 310/313 A |
| 6,700,300 B2 * | 3/2004 | Inoue et al. .............. 310/313 A |
| 7,285,894 B1 * | 10/2007 | da Cunha ................. 310/313 A |
| 7,737,603 B2 * | 6/2010 | Kando ..................... 310/313 R |
| 2009/0085429 A1 | 4/2009 | Nishiyama et al. |
| 2009/0115287 A1 * | 5/2009 | Kando ..................... 310/313 A |

FOREIGN PATENT DOCUMENTS

| | | |
|---|---|---|
| EP | 1 879 291 A1 | 1/2008 |
| JP | 10-084247 A | 3/1998 |
| WO | 98/52279 A1 | 11/1998 |
| WO | 2006/114930 A1 | 11/2006 |
| WO | 2007/145057 A1 | 12/2007 |

* cited by examiner

*Primary Examiner* — Mark Budd
(74) *Attorney, Agent, or Firm* — Keating & Bennett, LLP

(57) ABSTRACT

An acoustic wave device having an improved frequency-temperature characteristic and in which a spurious response of the higher order mode is suppressed includes a piezoelectric substrate made of $LiNbO_3$, a $SiO_2$ layer laminated on the piezoelectric substrate, and an IDT electrode disposed in an interface of the piezoelectric substrate and the $SiO_2$ layer, wherein $\phi$ and $\theta$ of Euler angles expressed by ($\phi$, $\theta$, $\psi$) of $LiNbO_3$ substrate satisfy $\phi=0°$ and $80° \leq \theta \leq 130°$, respectively. The acoustic wave device using an acoustic wave primarily having an SH wave, wherein $\psi$ is set to satisfy $5° \leq \psi \leq 30°$.

5 Claims, 25 Drawing Sheets

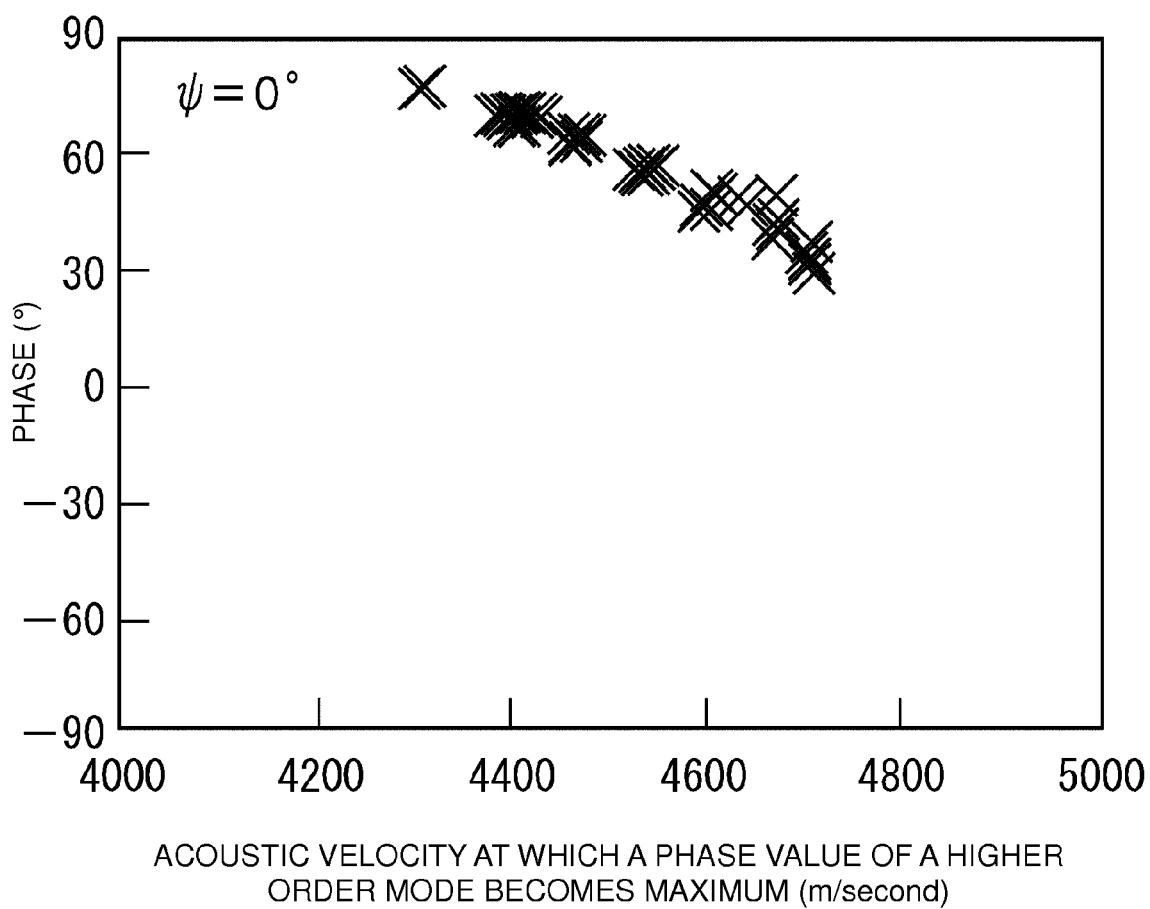

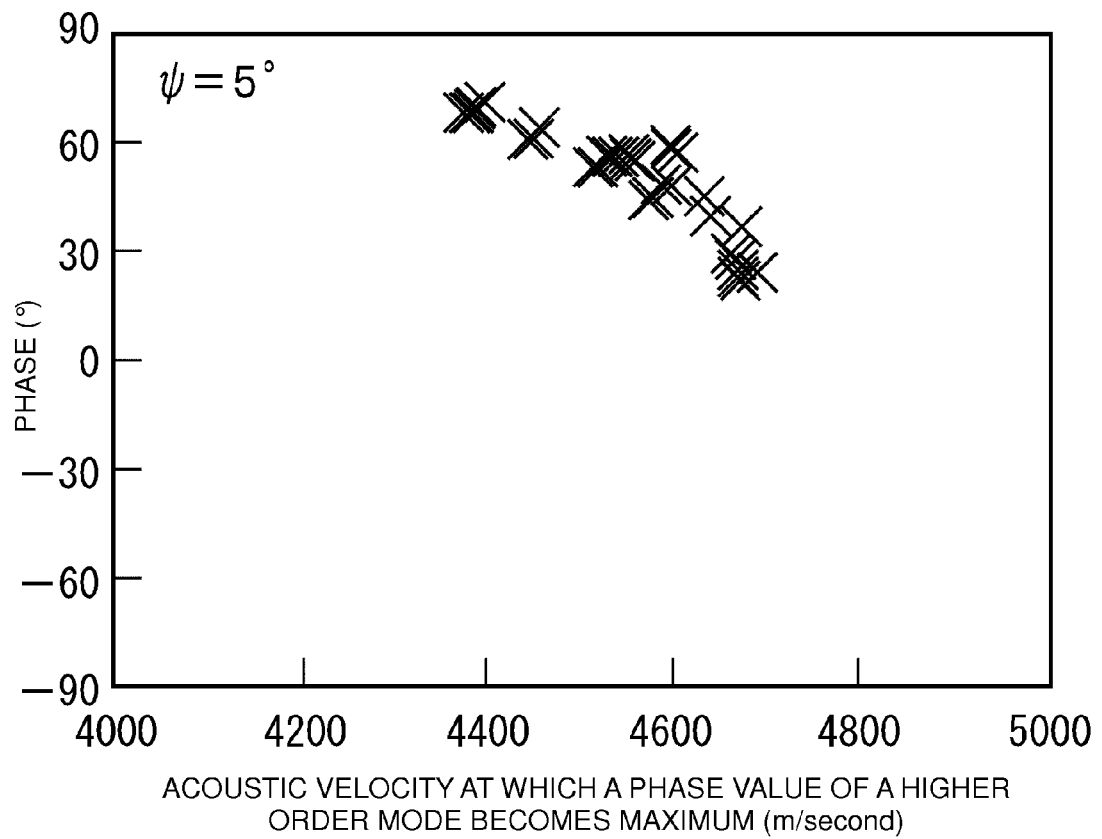

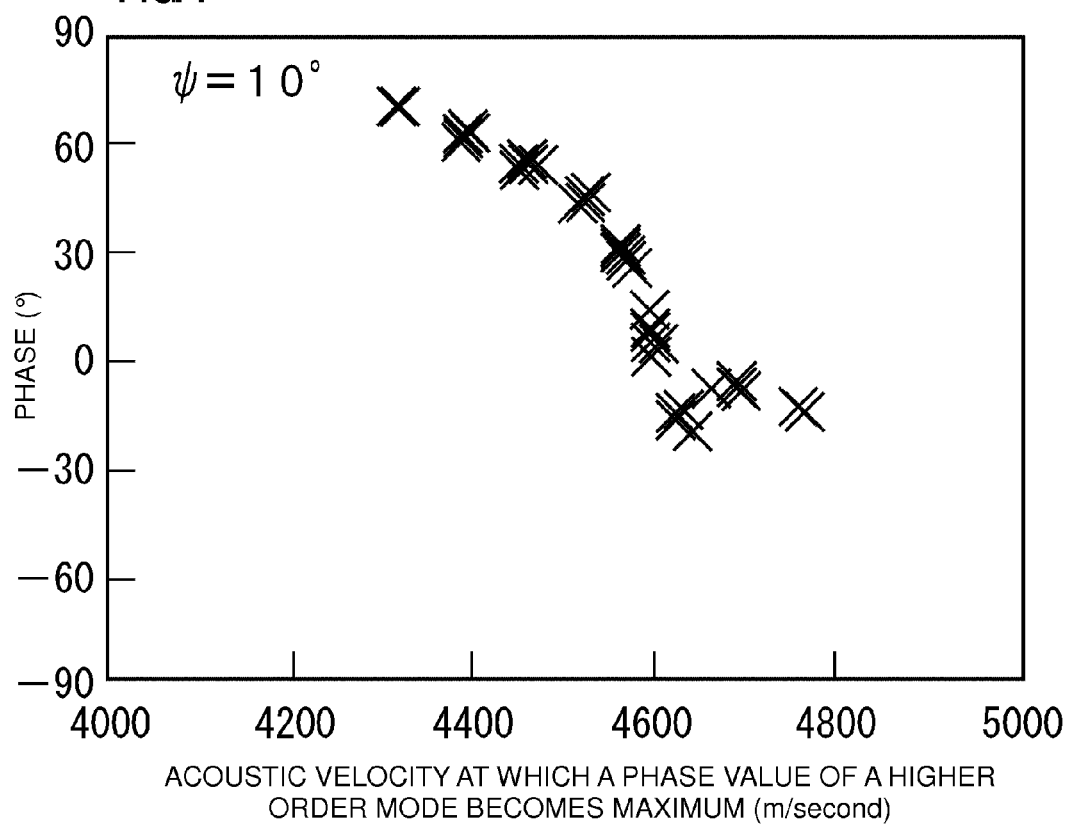

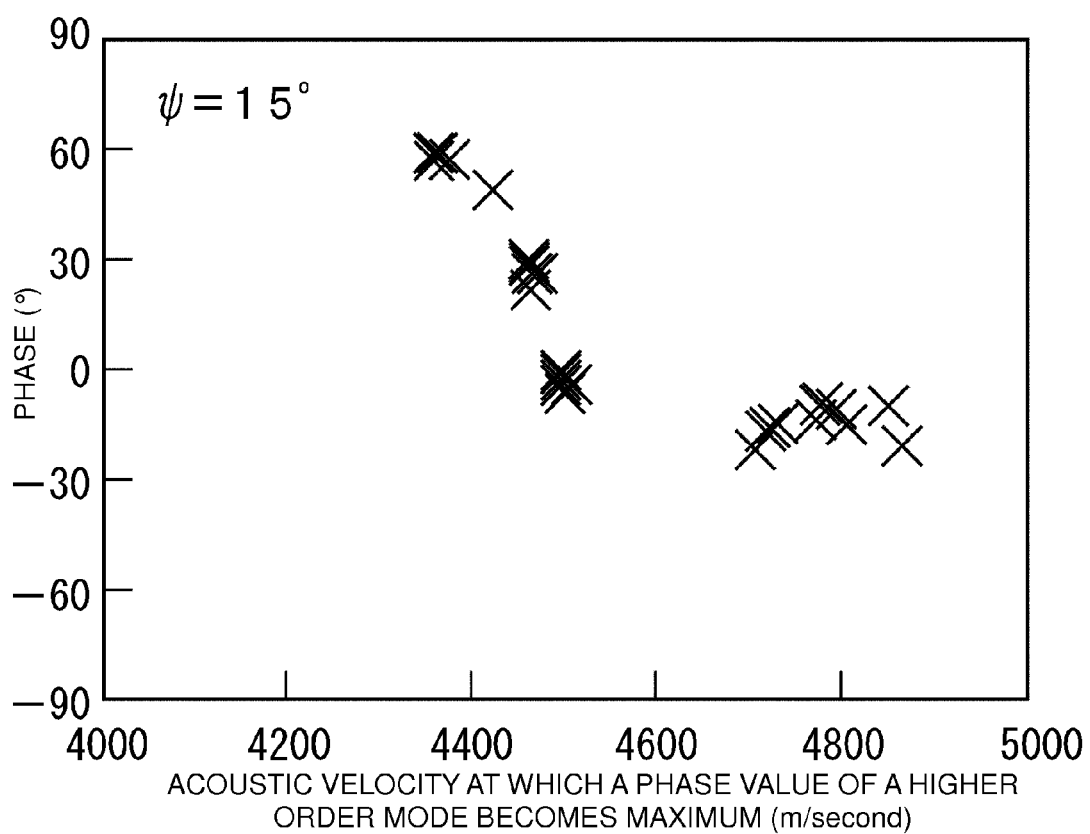

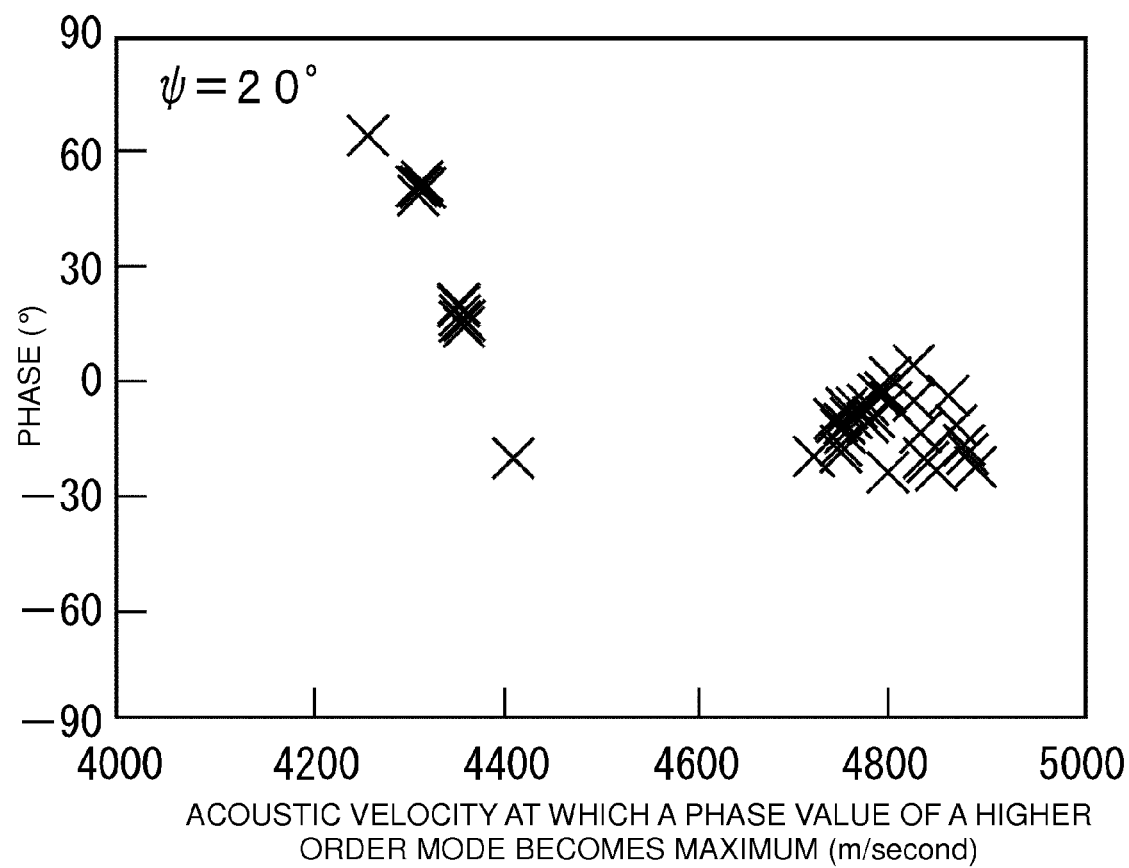

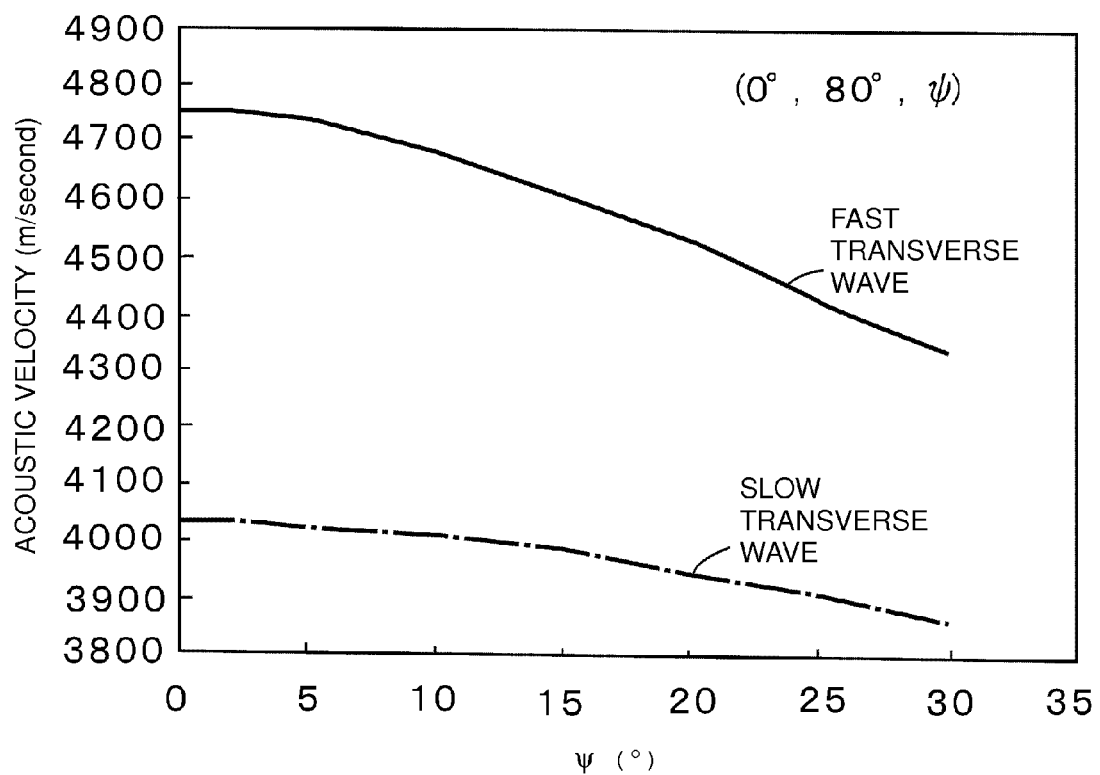

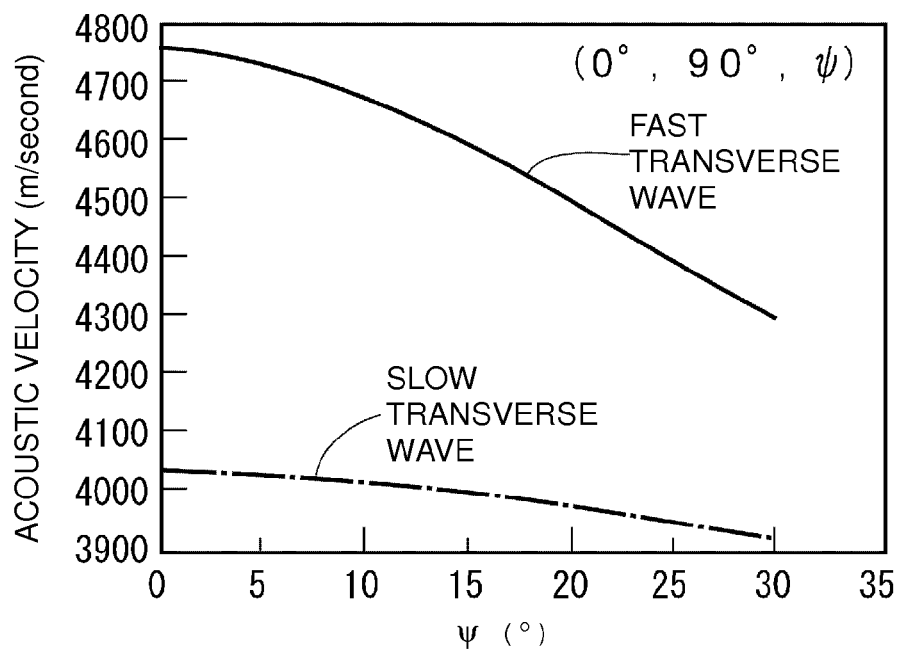
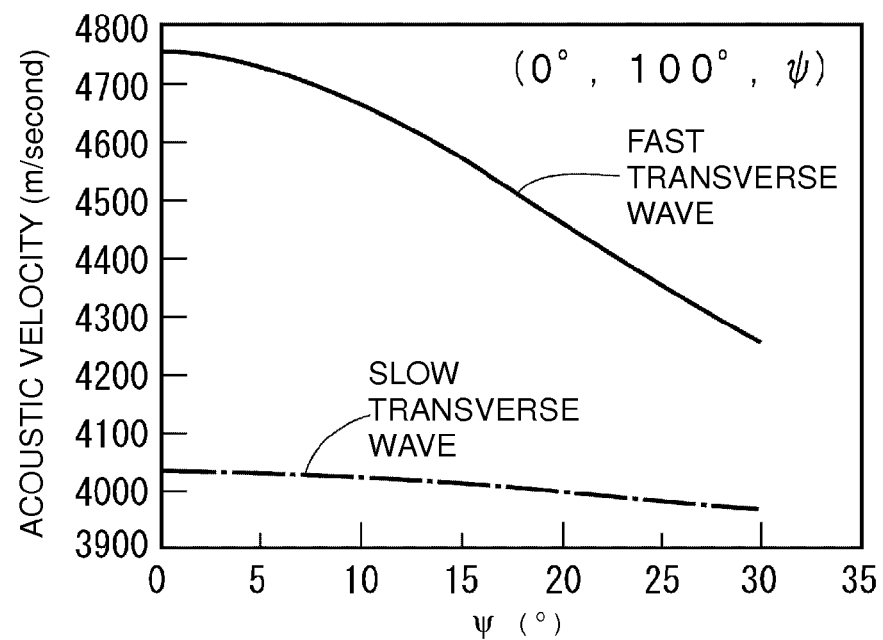

ACOUSTIC WAVE DEVICE

BACKGROUND OF THE INVENTION

1. Field of the Invention

The present invention relates to an acoustic wave device for use as a bandpass filter, a resonator, or other suitable devices, and more particularly, to an acoustic wave device including a dielectric layer, such as $SiO_2$, that is laminated on a piezoelectric substrate composed of $LiNbO_3$.

2. Description of the Related Art

Heretofore, acoustic wave devices, such as surface acoustic wave devices and boundary acoustic wave devices, have been used for bandpass filters, for example, in communication equipment.

One example of a boundary acoustic wave device is disclosed in International Publication No. WO98/52279. FIG. 24 is a plan view and FIG. 25 is a partially enlarged front cross-sectional view that shows a relevant portion of a boundary acoustic wave device disclosed therein.

The boundary acoustic wave device 1001 includes a $LiNbO_3$ substrate 1002. An IDT electrode 1003 is disposed on the substrate 1002. A polycrystalline silicon oxide film 1004 is laminated to cover the IDT electrode 1003. A polycrystalline silicon film 1005 is laminated over the polycrystalline silicon oxide film 1004.

A boundary acoustic wave excited at the IDT electrode 1003 is propagated such that the energy is concentrated in the polycrystalline silicon oxide film 1004 which is laminated between the $LiNbO_3$ substrate 1002 and the polycrystalline silicon film 1005. Particularly, a polycrystalline silicon film/a polycrystalline silicon oxide film/a $LiNbO_3$ are laminated in this order. That is, a boundary acoustic wave device having a three-medium structure is provided.

According to WO98/52279, since the polycrystalline silicon film 1005 is laminated over the polycrystalline silicon oxide film 1004, an acoustic wave excited at IDT electrode 1003 is reliably confined to the polycrystalline silicon oxide film.

International Publication No. WO2007/145057 describes a surface acoustic wave device that includes an IDT electrode provided on a $LiNbO_3$ substrate and the IDT is covered by a laminated $SiO_2$ film. In the surface acoustic wave device, the absolute value of the frequency-temperature coefficient TCF is reduced by forming the $SiO_2$ film. In addition, by increasing thickness of $SiO_2$ film in the range of about 0.24λ to about 0.35λ, where λ is a wave length, the occurrence of large spurious responses of a higher order mode is described.

In the boundary acoustic wave devices according to International Publication No. WO98/52279, boundary acoustic waves propagate through the polycrystalline silicon oxide film 1004 which is laminated between the $LiNbO_3$ substrate 1002 and the polycrystalline silicon film 1005 by confining energy therein. There is a problem in that a large spurious response of the higher order mode occurs. It is known that the amount of the spurious response of the higher order mode can be suppressed by decreasing the thickness of the polycrystalline silicon oxide film. However, there is a problem in that the absolute value of the frequency-temperature coefficient TCF of the boundary acoustic wave device 1001 is increased by decreasing the thickness of the polycrystalline silicon oxide film. That is, there is a trade-off between suppressing the spurious response of the higher order mode and improving the frequency-temperature characteristic.

In the boundary acoustic wave device disclosed in WO98/52279, an acoustic velocity of a transverse wave through the polycrystalline silicon oxide film is less than acoustic velocities of the transverse wave through the $LiNbO_3$ substrate and the polycrystalline silicon film. Since the polycrystalline silicon oxide film having a slow acoustic velocity is sandwiched between the polycrystalline silicon film and the $LiNbO_3$ substrate, both having a fast acoustic velocity, a boundary acoustic wave excited at the IDT electrode can be reliably confined in the polycrystalline silicon oxide film. The boundary acoustic waves of a basic order mode and the higher order mode propagate through the structure.

The basic order mode means displacement is smaller in the out-going direction of the polycrystalline silicon oxide film, and one anti-node exists in the polycrystalline silicon oxide film, that is 0 order mode. The higher order mode means displacement is smaller in the out-going direction of the polycrystalline silicon oxide film, and one node exists in the polycrystalline silicon oxide film, therefore two anti-nodes in displacement directions opposite to each other exist, that is, in the 1 order mode.

The higher order mode having multiple nodes in the polycrystalline silicon oxide film can exist. However, since the response of such a mode is relatively small, other than the higher order mode described above, this is not problematic.

As described above, WO2007/145057 describes that a large spurious response of the higher order mode appears by increasing thickness of $SiO_2$ film in the range about 0.24λ to about 0.35λ.

Accordingly, surface acoustic devices described in the International Publication No. WO2007/145057 also have a trade-off relationship between an improvement of the frequency-temperature characteristic by increasing the thickness of $SiO_2$ film and a suppression of the spurious response of the higher order mode.

SUMMARY OF THE INVENTION

To overcome the problems described above, preferred embodiments of the present invention provide an acoustic wave device in which a $SiO_2$ layer is laminated on a $LiNbO_3$ substrate, such that the frequency-temperature characteristic is improved by providing the $SiO_2$ layer, and the spurious response of the higher order mode is suppressed as well.

According to a preferred embodiment of the present invention, an acoustic wave device includes a piezoelectric substrate made of $LiNbO_3$, a dielectric layer laminated on the piezoelectric substrate and an IDT electrode disposed at an interface between the piezoelectric substrate and the dielectric layer, φ and θ of Euler angles expressed by (φ, θ, ψ) of the $LiNbO_3$ substrate satisfying φ=0°, 80°≦θ≦130°, respectively, the acoustic wave device using an acoustic wave having primarily an SH wave, wherein ψ is set to satisfy 5°≦ψ≦30°.

In a preferred embodiment of the present invention, a boundary acoustic wave device includes a $SiO_2$ layer defining the dielectric layer and further includes a second dielectric layer laminated on the $SiO_2$ layer and having an acoustic velocity greater than that of the $SiO_2$ layer, and using an SH type boundary acoustic wave as an acoustic wave. In such a boundary acoustic wave device that utilizes an SH type boundary acoustic wave, it is possible to improve the frequency-temperature characteristic and suppress the spurious response of the higher order mode.

In a preferred embodiment of the boundary acoustic wave device, θ of Euler angles of a $LiNbO_3$ substrate is preferably in the range of 105°≦θ≦120°, for example, such that a response of an unwanted mode which appears near the SH type boundary acoustic wave response can be suppressed.

Particularly, an electromechanical coupling factor of a Stoneley wave of an unwanted mode is very low.

In an acoustic wave device according to a preferred embodiment of the present invention that is defined by a boundary acoustic wave device, as a second dielectric layer, one of the dielectric materials is preferably selected from the group consisting of silicon, silicon nitride, aluminum oxide, aluminum nitride, silicon oxynitride and diamond-like carbon, for example, having a slow transverse wave acoustic velocity of at least about 5000 m/second. In this case, the SH type boundary acoustic wave is reliably confined in the $SiO_2$ layer because the transverse wave velocities of the dielectric material are faster than that of $SiO_2$ and a transverse wave velocity of the $LiNbO_3$ substrate is faster than that of the $SiO_2$.

In another preferred embodiments of the present invention, a surface acoustic wave device which includes $SiO_2$ layer defining the dielectric layer and utilizes an SH type surface acoustic wave as the acoustic wave is provided. With this surface acoustic wave device, it is possible to improve the frequency-temperature characteristic and to suppress the spurious response of the higher order mode at the same time.

When acoustic wave device according to a preferred embodiment of the present invention is a surface acoustic wave device, θ of Euler angles of a $LiNbO_3$ substrate is preferably in the range of about 80° to about 90°, for example. In such a case, the response of an unwanted mode which appears near the SH type surface wave response can be suppressed. That is, an electromechanical coupling factor of a Rayleigh wave, which is a response of an unwanted mode, can be decreased.

For the surface acoustic wave device, a second dielectric layer may preferably be laminated on the $SiO_2$ layer, for example. In such a case, the laminated dielectric layer protects the underlying $SiO_2$ layer and the IDT electrode.

In another preferred embodiment of the present invention, an acoustic wave device which includes an IDT electrode of an electrode film which is made of one of the metals selected from the group consisting of Au, Ag, Cu, Pt, Ta, W, Ni, Fe, Cr, Mo, Ti and an alloy including one of these metals as a main component, or laminated film with a second electrode film which is a different metal from the other metal films, for example, is preferably provided. In this case, the reflection coefficient of the IDT electrode is increased. Preferably, the laminate structure is provided with a plurality of electrode films made of Pt or Al or an alloy including one of these metals as a main component, for example. In this case, an IDT having high reliability and low resistivity is provided.

With acoustic wave devices according to various preferred embodiments of the present invention, the absolute value of a frequency-temperature coefficient TCF can be decreased due to the $SiO_2$ layer having a positive frequency-temperature coefficient while piezoelectric substrate made of $LiNbO_3$ has a negative frequency-temperature coefficient. In addition, even if a film thickness of the $SiO_2$ layer is selected so as to have a decreased frequency-temperature coefficient TCF, since ψ of Euler angles of $LiNbO_3$ substrate is set in the specific range described above, the spurious response of the higher order mode can be reliably suppressed.

Thus, a frequency-temperature characteristic can be improved while the spurious response of the higher order mode is simultaneously decreased.

Other elements, features, steps, characteristics and advantages of the present invention will become more apparent from the following detailed description of the preferred embodiments with reference to the attached drawings.

BRIEF DESCRIPTION OF THE DRAWINGS

FIG. 5 shows a relationship of an acoustic velocity at which a phase value of a higher order mode becomes a maximum value and the strength of the spurious response of the higher order mode with a boundary acoustic wave device including a $LiNbO_3$ substrate having Euler angles (0°, 115°, 0°).

FIG. 6 shows a relationship of an acoustic velocity at which a phase value of a higher order mode becomes a maximum value and the strength of the spurious response of the higher order mode with a boundary acoustic wave device including a $LiNbO_3$ substrate having Euler angles (0°, 115°, 5°).

FIG. 7 shows a relationship of an acoustic velocity at which a phase value of a higher order mode becomes a maximum value and the strength of the spurious response of the higher order mode with a boundary acoustic wave device including a $LiNbO_3$ substrate having Euler angles (0°, 115°, 10°).

FIG. 8 shows a relationship of an acoustic velocity at which a phase value of a higher order mode becomes a maximum value and the strength of the spurious response of the higher order mode with a boundary acoustic wave device including a $LiNbO_3$ substrate having Euler angles (0°, 115°, 15°).

FIG. 9 shows a relationship of an acoustic velocity at which a phase value of a higher order mode becomes a maximum value and the strength of the spurious response of the higher order mode with a boundary acoustic wave device including a $LiNbO_3$ substrate having Euler angles (0°, 115°, 20°).

FIG. 10 shows relationships of the acoustic velocities of a fast transverse wave and a slow transverse wave with ψ in a $LiNbO_3$ substrate having Euler angles (0°, 80°, ψ).

FIG. 11A and FIG. 11B show a relationship of an acoustic velocity of a fast transverse wave and a slow transverse wave with ψ in a $LiNbO_3$ substrate having Euler angles (0°, 90°, ψ) and (0°, 100°, ψ), respectively.

DETAILED DESCRIPTION OF PREFERRED EMBODIMENTS

Hereinafter, the present invention will be disclosed using the following preferred embodiments of the present invention with reference to the accompanying drawings.

Figure 1A:
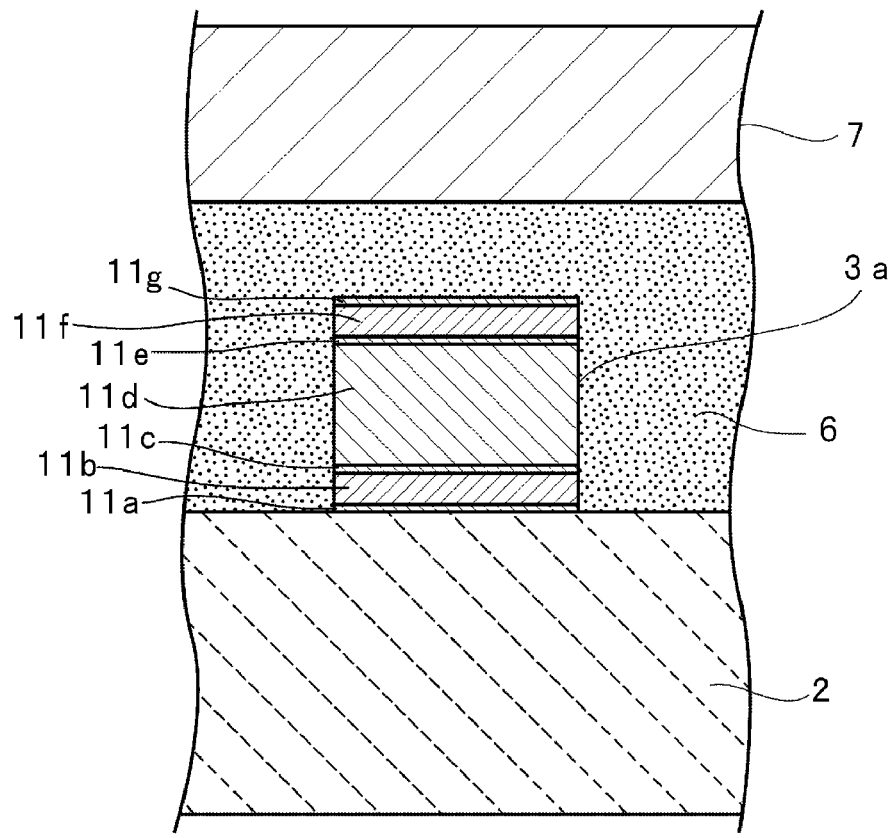
FIGS. 1A and 1B are a partial cutaway enlarged front cross-sectional view of a main portion of a boundary acoustic wave device according to a preferred embodiment of the present invention and a schematic plan view showing an electrode structure thereof.
Figure 1B:
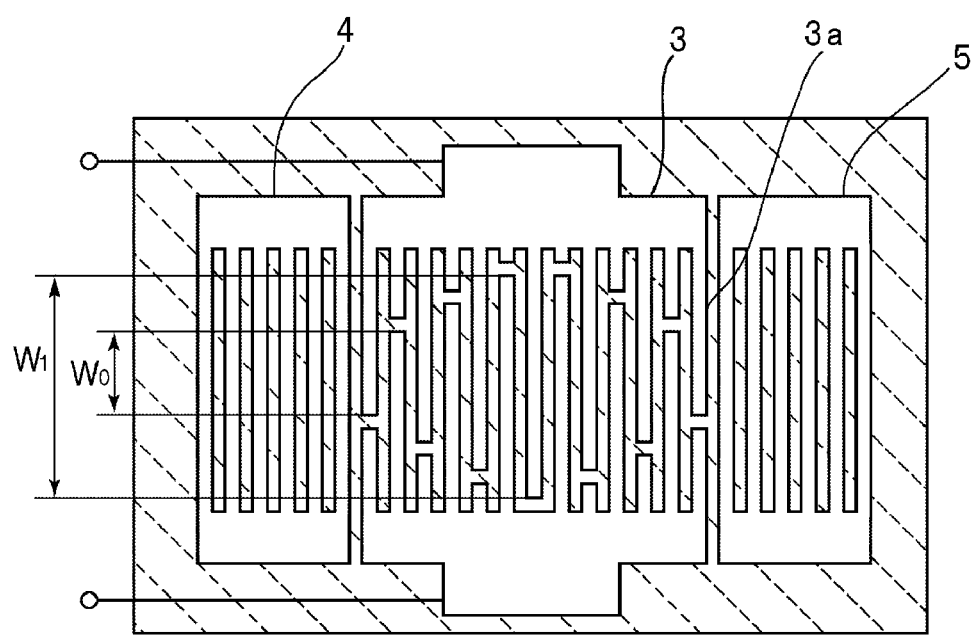

FIG. 1A is a schematic partial cutaway front cross-sectional view of a boundary acoustic wave device according to a preferred embodiment of the present invention and FIG. 1B is a schematic plan view showing an electrode structure thereof.

As shown in FIG. 1A, the boundary acoustic wave device includes a piezoelectric substrate 2 made of LiNbO$_3$, for example. A SiO$_2$ layer 6 is laminated on the piezoelectric substrate 2.

An IDT electrode 3 is disposed at the interface between the piezoelectric substrate 2 and the SiO$_2$ layer 6. FIG. 1A shows a partial cutaway enlarged cross-sectional view of one finger of the IDT electrode 3. Practically, as shown in FIG. 1B, the IDT electrode 3 and reflectors 4 and 5 are disposed on the piezoelectric substrate 2, wherein the reflectors 5 and 6 are disposed at two sides of the IDT electrode 3 in a boundary acoustic wave propagating direction. A crossing width of the IDT electrode 3 is weighted and the IDT electrode 3 includes a plurality of interdigitated fingers. FIG. 1A shows one of the fingers 3a in enlarged manner.

As shown in FIG. 1B, compared to a crossing width W$_0$ at each end of a boundary acoustic wave propagating direction in the IDT electrode 3, a crossing width W$_1$ at a central portion of the IDT electrode 3 is greater. Particularly, the crossing width W$_1$ is the largest crossing width and a crossing width of the IDT electrode 3 is weighted such that the crossing width decreases towards each end of the IDT electrode 3. The reflectors 4 and 5 are preferably grating reflectors, for example.

A one-port type electrode structure of a boundary acoustic wave resonator includes the IDT electrode 3 and the reflectors 4 and 5 as described above.

The IDT electrode 3 and reflectors 4 and 5 are made of any suitable metal. According to a preferred embodiment of the present invention, as shown in FIG. 1A in enlarged manner, the electrode finger 3a of the IDT electrode 3 preferably includes laminated metal films, such as a Ti film 11a, a Pt film 11b, a Ti film 11c, an Al film 11d, a Ti film 11e, a Pt film 11f, and a Ti film 11g, for example, in this order from the piezoelectric substrate 2 side. In the laminated metal films, the Pt film 11b, the Al film 11d, and the Pt film 11f are preferably thicker than the Ti films 11a, 11c, 11e and 11g. The Pt film 11b, the Al film 11d, and the Pt film 11f are main electrode films. The Ti film 11a functions as an adhesive layer to increase the adhesiveness of the IDT electrode 3 on to the piezoelectric substrate. The Ti films 11c and 11e define barriers to inhibit diffusion between metals disposed at both sides of the Ti film. Specifically, the Ti films 11c and 11e are arranged to suppress atomic diffusion between the Pt film 11b and the Al film 11d, and the Pt film 11f and the Al film 11d, respectively. In addition, the Ti film 11g is arranged to be an adhesive layer to adhere the SiO$_2$ layer and the Pt film. The entire IDT electrode 3 is defined by a laminated metal film and reflectors 4 and 5 are made using the same or substantially the same laminated metal film.

According to a preferred embodiment of the present invention, the IDT electrode is not necessarily defined by a laminated metal film. Although metal materials for the IDT electrode are not particularly limited, Au, Ag, Cu, Pt, Ta, W, Ni, Fe, Cr, Mo, Ti or an alloy composed of one of these metal as a main component, for example, are preferably used. The IDT electrode 3 may be defined only by an electrode film. As shown in FIG. 1A, the Ti films 11a, 11c, 11e and 11g which define an adhesive layer, a barrier layer or a protection layer, other than the main electrode materials, such as the Al film and the Pt film, may also preferably be laminated.

By using the above described metal, a reflection coefficient and a conductivity of the IDT electrode can be increased. Thereby, the characteristics of the boundary acoustic wave device can be further improved.

More preferably, Pt and Al, for example, are used for the main electrode film in a preferred embodiment of the present invention. In that case, the reflection coefficient and the conductivity are efficiently increased.

In the boundary acoustic wave device 1 of a preferred embodiment of the present invention, a SiO$_2$ layer 6 is laminated on a piezoelectric substrate 2 so as to cover the IDT electrode 3, and a second dielectric layer 7 is laminated thereon. According to the present preferred embodiment of the present invention, the second dielectric layer 7 is preferably defined by a SiN film.

The SiO$_2$ layer 6 and the second dielectric layer 7 defined by a SiN film can be formed by suitable thin film forming processes, such as deposition or sputtering, for example. As described in Japanese Unexamined Patent Application Publication No. 10-84247, the second dielectric layer 7 may be formed by a bonding substrates process, for example.

Although the thickness of the SiO$_2$ layer 6 is not limited, the thickness is preferably in the range of about 0.2λ to about 0.7λ, for example, where λ is the wave length of the boundary acoustic wave. Since an acoustic velocity of the transverse wave through the SiO$_2$ layer 6 is slower than the acoustic velocity of the transverse wave through SiN or LiNbO$_3$, a boundary acoustic wave excited at IDT electrode 3 is propagated as the energy is concentrated between SiN and LiNbO$_3$, that is, in the SiO$_2$ layer 6. In order to make such propagation possible, the thickness of the SiO$_2$ layer 6 is preferably in the range of about 0.2λ to about 0.7λ, for example. However, this thickness is not particularly limited.

The thickness of SiN film 7 is set such that the boundary acoustic wave is reliably confined. The displacement of the boundary acoustic wave becomes smaller in the thickness direction of the SiN film. Therefore, the SiN film thickness is preferably set such that the displacement of the boundary acoustic wave becomes nearly zero at the surface of the SiN film 7. The thickness at which the displacement becomes about zero is equal to or greater than about 1λ, for example.

The above described electrodes structure including the IDT electrode 3 can be formed by publically known photolithograph process, for example.

In the boundary acoustic wave device 1 according to a preferred embodiment of the present invention, the boundary acoustic wave excited at the IDT electrode 3, which is disposed between the above described piezoelectric substrate 2 made of LiNbO$_3$ and the SiO$_2$ layer 6, is propagated such that the energy is concentrated in the SiO$_2$ layer 6. Meanwhile, the dielectric layer 7 is defined by a SiN film, and an acoustic velocity of a transverse wave propagating therethrough is faster than an acoustic velocity of the transverse wave through the SiO$_2$ layer 6. Accordingly, since the boundary acoustic wave cannot leak easily to the dielectric layer 7 side, which includes a SiN film, it is possible to propagate the boundary acoustic wave while concentrating the energy in the SiO$_2$ layer 6.

In addition, the boundary acoustic wave device 1 can decrease the absolute value of frequency-temperature coefficient, because the SiO$_2$ layer has a positive frequency-temperature coefficient TCF while piezoelectric substrate made of LiNbO$_3$ has a negative frequency-temperature coefficient TCF. Therefore, the frequency drift caused by a temperature change can be decreased.

Additionally, when φ and θ of Euler angles of a LiNbO$_3$ substrate expressed by (φ, θ, ψ) satisfies φ=0° and 80°≦θ≦130° respectively, ψ is set to satisfy 5°≦ψ≦30° in the acoustic wave device which primarily utilizes an SH wave. As will be clear from experimental examples described later, the spurious response of the higher order mode can be reliably suppressed. Hereinafter, it will be described specifically with reference to the FIG. 2 to FIG. 15.

As boundary acoustic wave devices shown in FIGS. 1A and 1B, 1 port type boundary acoustic wave resonators using a LiNbO$_3$ substrate of various propagation angles (ψ) were prepared, and impedance characteristics and phase characteristics thereof were measured.

Specifications of the prepared boundary acoustic wave resonators were as follows.

Euler angles of the LiNbO$_3$ substrate: (0°, 115°, ψ) and propagation angles ψ of 0°, 5°, 10°, 15°, 20° 25° and 30° were set.

Wave length determined by interval of the IDT electrode fingers λ=about 1.9 μm.

Film thickness of the IDT electrode: Thickness of the Pt film 11*b* and 11*f*=about 31 nm, Thickness of the Al film 11*d*=about 300 nm, Thickness of the Ti film 11*a*, 11*c*, 11*e* and 11*g*=about 10 nm.

Duty of the IDT electrode=about 0.5.

Number of the electrode fingers=about 60 pairs.

Gap of facing bus bar=about 30λ.

Apodization ratio of the IDT electrode (minimum crossing width W$_0$/maximum crossing width W$_1$)=about 0.4.

Film thickness of the SiO$_2$ layer=about 712 nm

Film thickness of the dielectric layer 7 composed of SiN=about 2000 nm.

Number of the electrode fingers of the reflectors=51 each.

Figure 2A:
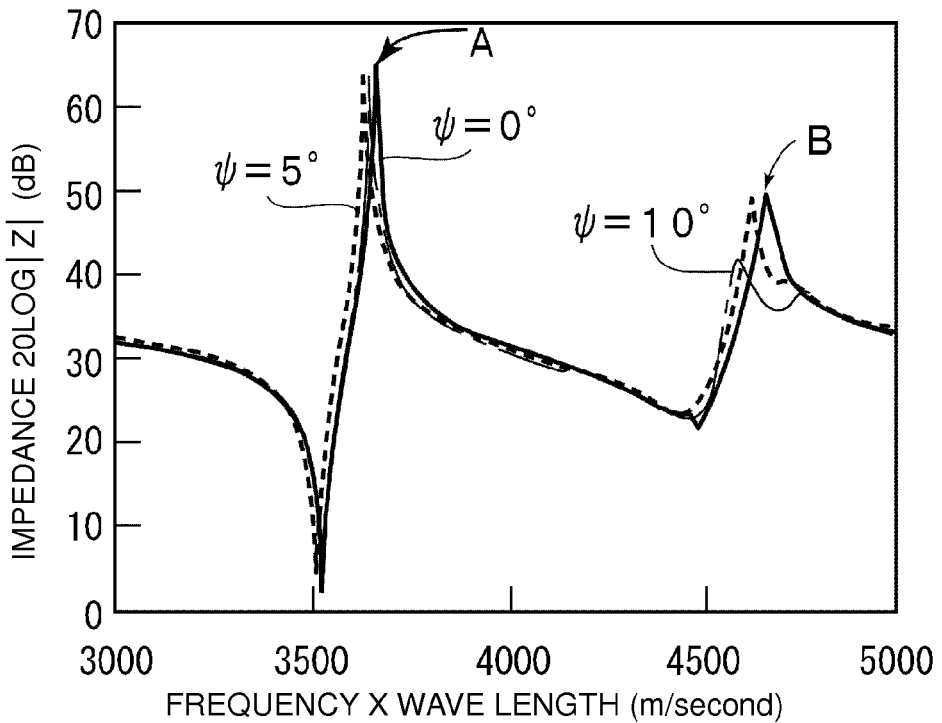
FIG. 2A shows the impedance characteristics of a boundary acoustic wave device including a $LiNbO_3$ substrate having Euler angles (0°, 115°, ψ), where Wψ is 0°, 5° or 10°.
Figure 2B:
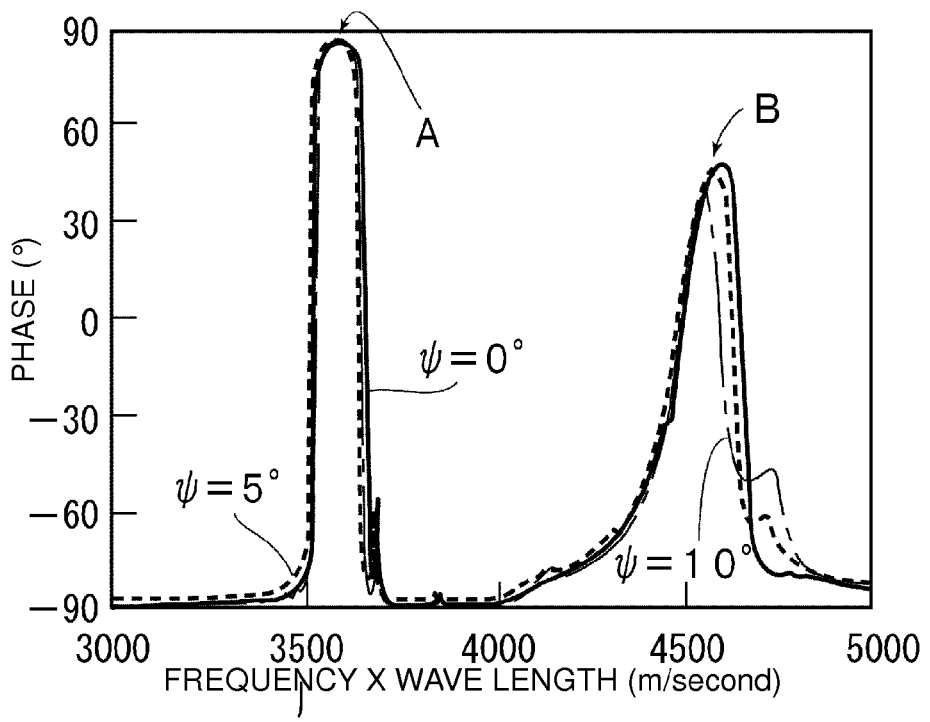
FIG. 2B shows the phase characteristics thereof.

In FIGS. 2A and 2B to FIGS. 4A and 4B, the horizontal axis shows the acoustic velocity which is expressed as a product of frequency by wave length. In the graph, A is a response by the basic mode of an SH type boundary wave, and B is a response by the higher order mode. FIGS. 2A and 2B show the impedance characteristics and the phase characteristics of boundary acoustic wave devices when the propagation angle ψ is about 0°, about 5° or about 10°, respectively. In FIGS. 2A and 2B, the solid line shows a result where ψ=about 0°, the broken line shows a result where ψ=about 5° and the chain line shows a result when ψ=about 10°.

Figure 3A:
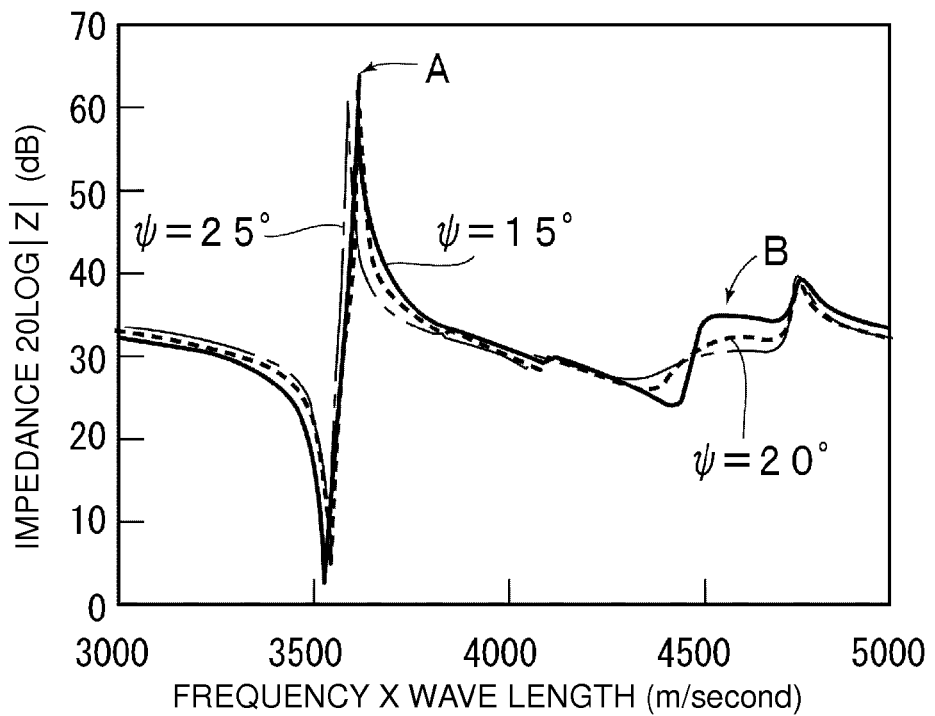
FIG. 3A shows the impedance characteristics of a boundary acoustic wave device including a $LiNbO_3$ substrate having Euler angles (0°, 115°, ψ), where ψ is 15°, 20° or 25°.
Figure 3B:
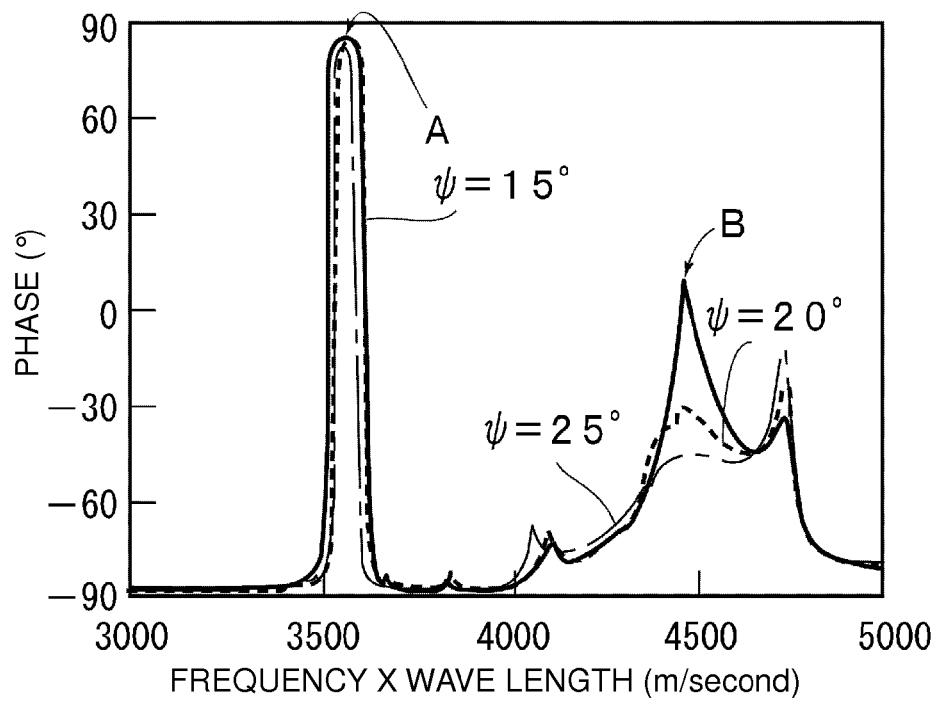
FIG. 3B shows the phase characteristics thereof.

Similarly, FIGS. 3A and 3B show the impedance characteristics and the phase characteristics of each boundary acoustic wave device when propagation angle ψ is about 15°, about 20° or about 25°, respectively. The solid line shows a result where ψ=about 15°, the broken line shows a result where ψ=about 20° and the chain line shows a result where ψ=about 25°.

Figure 4A:
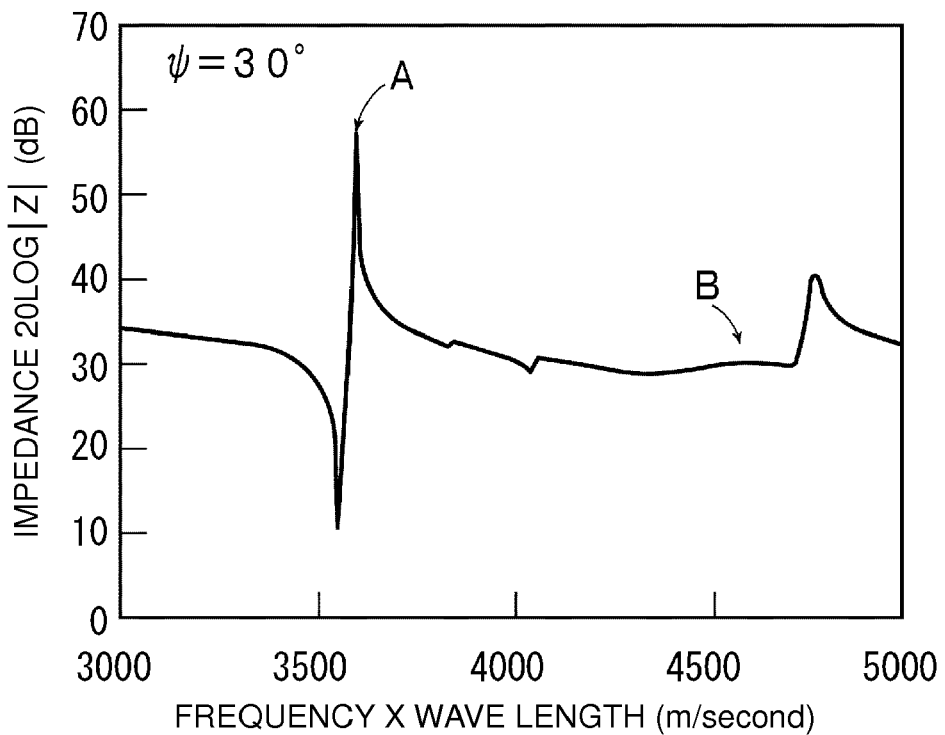
FIG. 4A shows the impedance characteristics of a boundary acoustic wave device including a $LiNbO_3$ substrate having Euler angles (0°, 115°, ψ), where ψ is 30°.
Figure 4B:
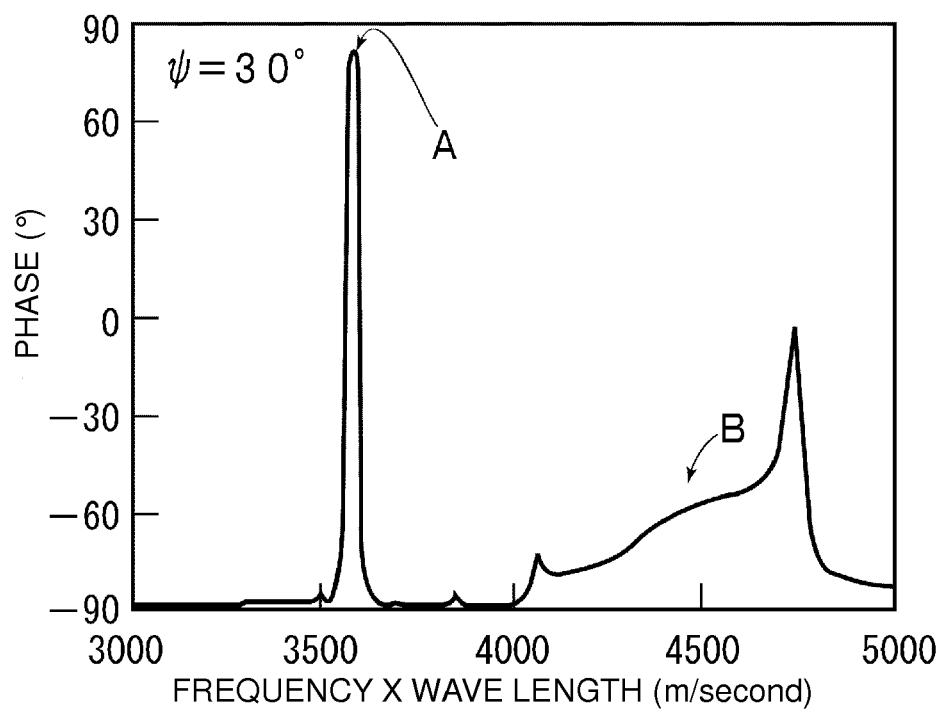
FIG. 4B shows the phase characteristics thereof.

FIGS. 4A and 4B show the impedance characteristics and the phase characteristics of a boundary acoustic wave device when propagation angle ψ is about 30°

As shown in FIGS. 2A and 2B to FIGS. 4A and 4B, when a LiNbO$_3$ substrate having Euler angles (0°, 115°, ψ) is used, the response of the higher order mode which is indicated by arrow B in FIGS. 2A and 2B, for example, is decreasing as the propagation angle ψ increases from about 0° to about 30°. Here, the arrow A indicates the response of a basic mode. Arrow B indicates the response of the higher order mode.

Accordingly, it is understood, when a LiNbO$_3$ substrate having Euler angles (0°, 115°, ψ) is used, the spurious response of the higher order mode is suppressed by arranging ψ to be more than about 0°, and more preferably in the range of about 5° to about 30°, as compared to the case at ψ=0° that is X propagation. In addition, considering the results shown in FIGS. 2A and 2B to FIGS. 4A and 4B, in the phase characteristics, an acoustic velocity at which a phase value of the higher order mode becomes a maximum value and the phase value at that time were obtained. The acoustic velocity at which the phase value of the higher order mode becomes the maximum value is defined as the acoustic velocity of the higher order mode. The phase value at that time is defined as the response strength of the higher order mode.

FIG. 5 to FIG. 9 show results of the response strengths of the higher order mode versus the acoustic velocities of the higher order mode.

In order to obtain the results shown in FIG. 5 to FIG. 9, many kinds of 1 port type boundary wave devices which have IDT electrodes with different wave lengths and different line widths were prepared in the same piezoelectric wafer. Then, characteristics of the 1 port type boundary wave devices were measured. Markings x in FIG. 5 to FIG. 9 are plotted relationships, in the acoustic wave boundary devices with the same Euler angles but different process condition, between acoustic velocities of the higher order mode at which the phase value of the higher order mode become a maximum value and the phase values at which the response strength of the higher order mode become a maximum value. These graphs show characteristics of boundary acoustic wave devices formed on a one sheet of wafer by using photo masks having a different wave length λ of the IDT of about 1.5 μm, about 1.6 μm, about 1.7 μm, about 1.8 μm, about 1.9 μm, about 2.0 μm, and about 2.1 μm, for example.

As shown in FIG. 5 to FIG. 9, when an acoustic velocity of the higher order mode exceeds a certain value, the response strength of the higher order mode sharply decreased with any ψ of the propagation angle. That is, there is a threshold value in the acoustic velocity of the higher order mode at which the response strength of the higher order mode is decreased. By comparing the threshold values in the acoustic velocity at each ψ value, it is understood that the threshold values is smaller when ψ is equal to or greater than about 5° as compared to the threshold value when ψ is about 0°.

This is understood as follow. In the boundary acoustic wave device 1 having a three-media structure, the $SiO_2$ layer 6 defining a relatively slow acoustic velocity medium is sandwiched between relatively fast acoustic velocity media which are the piezoelectric substrate 2 including a $LiNbO_3$ and the second dielectric layer 7 defined by a SiN film, thereby the boundary acoustic wave is confined by waveguide effect. That is, in the above described three-media structure, when the acoustic velocity of the basic mode in the SH type acoustic waves becomes greater than the acoustic velocity of transverse wave through $LiNbO_3$ or SiN, the basic mode of the SH type boundary acoustic wave becomes a leakage mode and attenuations become large. Meanwhile, the response strength of the higher order mode is decreased when the acoustic velocity at which the phase value of the higher order mode becomes a maximum value exceeds a certain value, because the higher order mode is leaked to the $LiNbO_3$ side as the acoustic velocity of the higher order mode exceeds the fast acoustic velocity of the transverse wave through $LiNbO_3$.

Accordingly, if the fast acoustic velocity of the transverse wave through $LiNbO_3$ is set relatively low, the response strength of the higher order mode can be decreased. According to a preferred embodiment of the present invention, since the propagation angle ψ is set equal to or greater than about 5°, the fast acoustic velocity of the transverse wave through $LiNbO_3$ is maintained adequately low and subsequently the spurious response of the higher order mode is suppressed.

The above described suppression is confirmed with FIG. 10 to FIG. 14.

FIG. 10 to FIG. 14 show the relationship between the propagation angle ψ in Euler angles (0°, θ, ψ) of $LiNbO_3$ and the fast acoustic velocity of the transverse wave and the slow acoustic velocity of the transverse wave. Here, the solid line shows the fast acoustic velocity of the transverse wave and the chain line shows the slow acoustic velocity of the transverse wave.

Figure 12A:
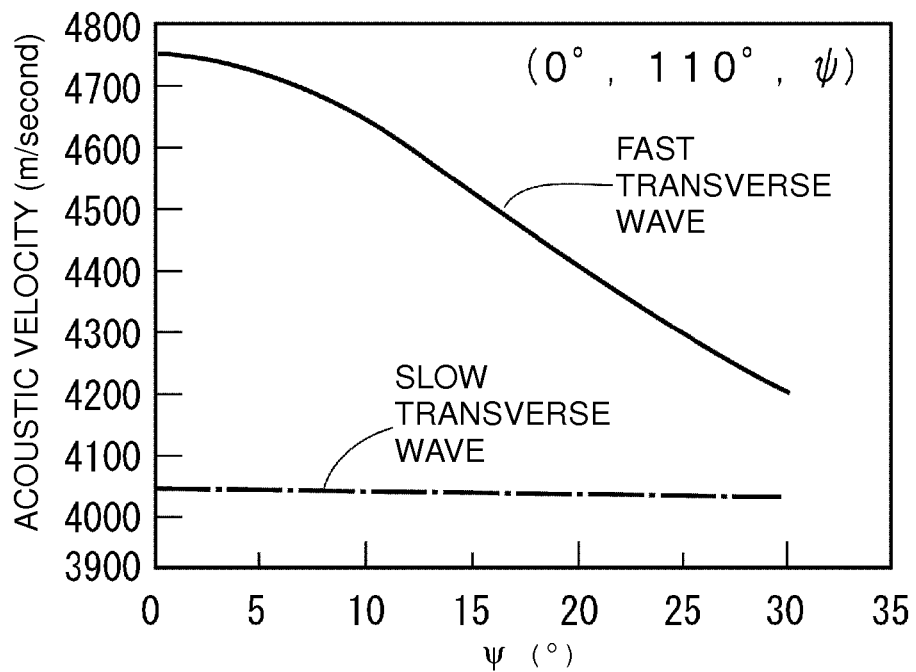
FIG. 12A and FIG. 12B show a relationship of an acoustic velocity of a fast transverse wave and a slow transverse wave with ψ in a $LiNbO_3$ substrate having Euler angles (0°, 110°, ψ) and (0°, 115°, ψ), respectively.
Figure 12B:
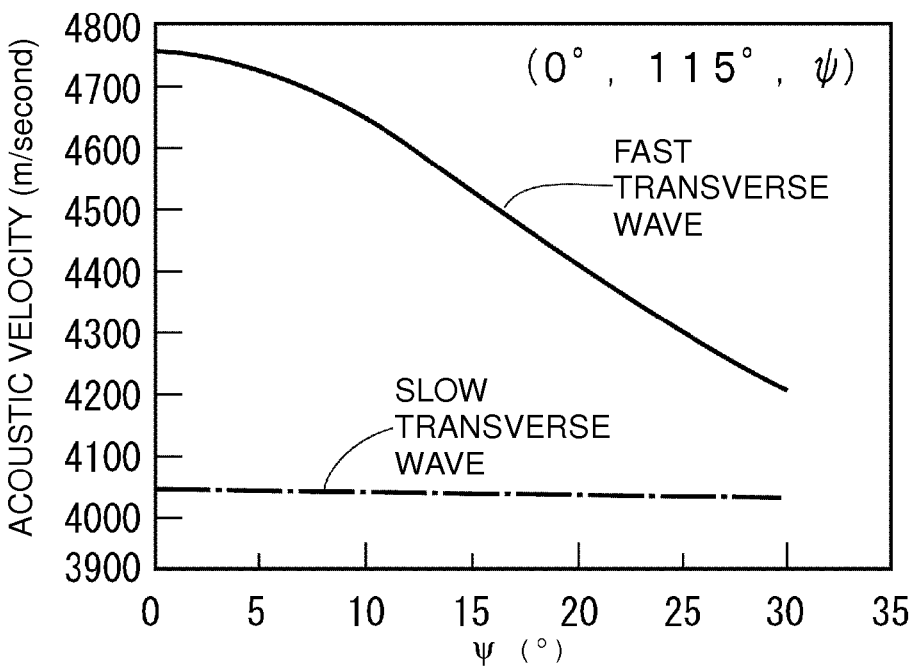
Figure 13:
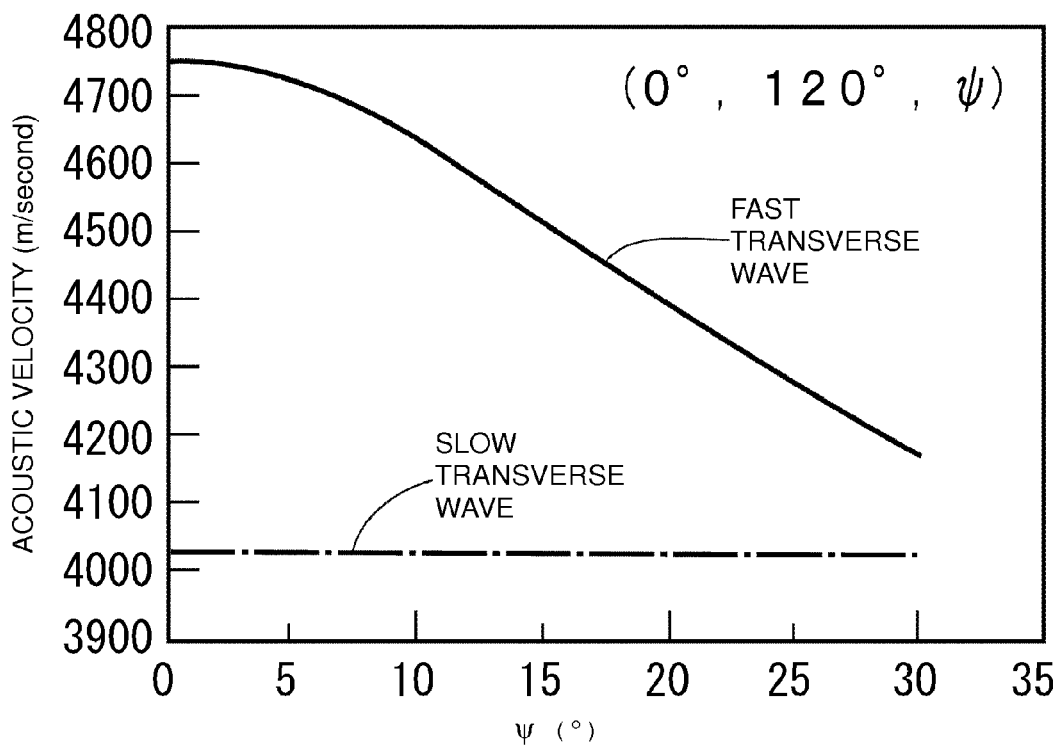
FIG. 13 shows a relationship of an acoustic velocity of a fast transverse wave and a slow transverse wave with ψ in a $LiNbO_3$ substrate having Euler angles (0°, 120°, ψ).
Figure 14:
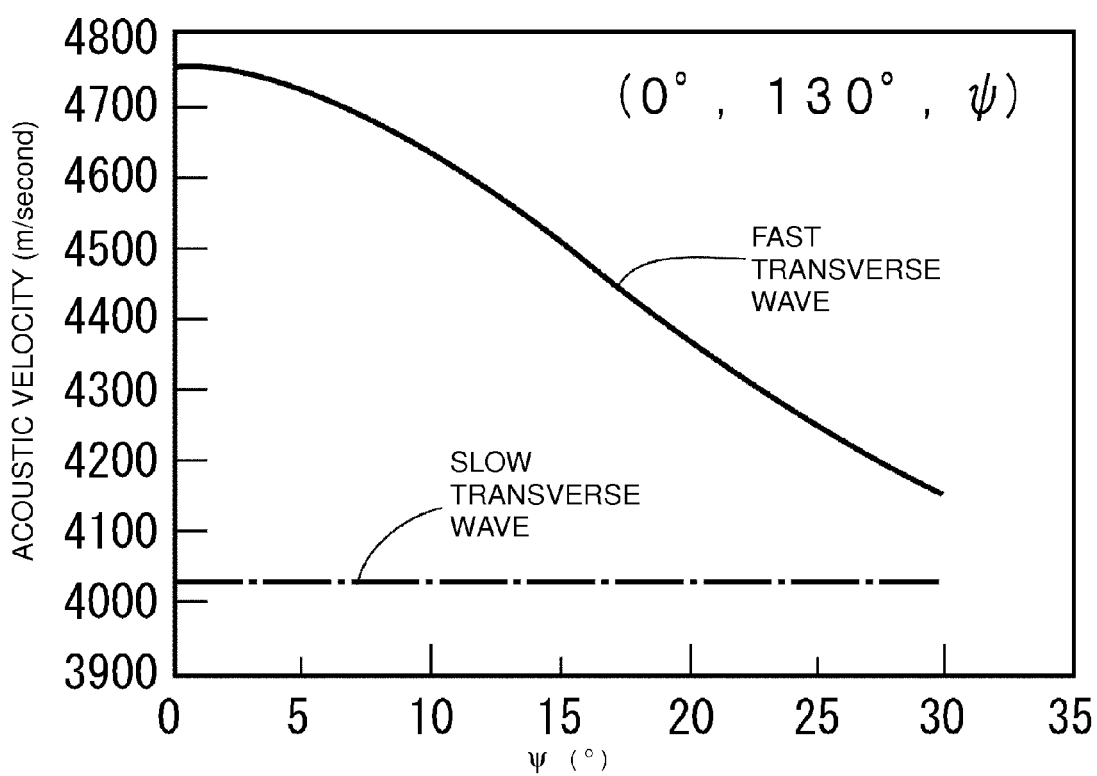
FIG. 14 shows a relationship of an acoustic velocity of a fast transverse wave and a slow transverse wave with ψ in a $LiNbO_3$ substrate having Euler angles (0°, 130°, ψ).

FIG. 10 shows a result with Euler angles (0°, 80°, ψ), FIGS. 11A and 11B show a result with Euler angles (0°, 90°, ψ) and (0°, 100°, ψ), respectively, FIGS. 12A and 12B show a result with Euler angles (0°, 110°, ψ) and (0°, 115°, ψ), respectively, FIG. 13 shows a result with Euler angles (0°, 120°, ψ), and FIG. 14 shows a result with Euler angles (0°, 130°, ψ).

As shown in FIG. 10 to FIG. 14, at any of the Euler angles θ in the range about 80° to about 130°, the fast acoustic velocity of the transverse wave decreases in accordance with an increase in ψ from about 0° toward about 30°. Therefore, as described above, the response strength of the higher order mode is decreased by increasing ψ of the propagation angle.

As shown in FIG. 10 to FIG. 14, at any Euler angles θ in the range of about 80° to about 130°, the fast acoustic velocity of the transverse wave is decreased in accordance with an increase in ψ of propagation angle. Therefore, the spurious response of the higher order mode is suppressed.

As described above, in view of the dependency of the fast acoustic velocity of the transverse wave on the propagation angle ψ in Euler angles (0°, 115°, ψ) and the relationship between the acoustic velocity at which the phase value of the higher order mode becomes a maximum value and the response strength of the higher order mode in FIG. 5 to FIG. 9, the fast acoustic velocity of the transverse wave through $LiNbO_3$ at each propagation angle ψ corresponds to a threshold value of the acoustic velocity at which the phase value of the higher order mode becomes a maximum value, it is possible to suppress the higher order mode by using larger value of ψ and achieve the fast acoustic velocity of the transverse wave low.

In addition, from FIG. 10 to FIG. 14, when ψ is in the range less than about 5°, the fast acoustic velocity of the transverse wave through $LiNbO_3$ is substantially unchanged from the value ψ of about 0°. In addition, when ψ is equal to or greater than about 5°, the fast acoustic velocity of the transverse wave is greatly decreased. Accordingly, ψ is preferably set equal to or greater than about 5°.

However, when ψ is too large, an electromechanical coupling factor $K^2$ of a basic mode is decreased. In order to avoid decreasing of the electromechanical coupling factor of the basic mode, it is preferable that ψ is relatively small. However, an upper limit of the ψ value may be different based on the application. In the case of a narrow band filter which requires a low electromechanical coupling factor $K^2$, for example, the upper limit can be substantially large.

In the case of a RF filter, which is a primary application for the boundary acoustic wave devices of the preferred embodiment of the present invention, since an appropriate amount of electromechanical coupling factor $K^2$ is required, the propagation angle ψ is preferably equal to or less than about 30°. Accordingly, in preferred embodiments of the present invention, ψ is preferably set equal to or greater than about 5° and equal to or less than about 30°, for example.

As shown in FIG. 10 to FIG. 14, even if θ of the Euler angles is changed, the fast acoustic velocity of the transverse wave through $LiNbO_3$ is still decreased by increasing ψ of propagation angle. Therefore, θ is not limited to about 115° and may be in the range of about 80°≦θ≦130°. When θ is in this range, the electromechanical coupling factor of the SH type boundary acoustic wave is relatively high. More preferably, by setting θ in the range of about 105°≦θ≦120°, an unwanted mode can be suppressed.

According to a preferred embodiment of the present invention, a second dielectric layer 7 is preferably defined by a SiN film which has a larger acoustic velocity of transverse wave than that of the $SiO_2$ film. It is preferable to make the second dielectric layer 7 with appropriate dielectric materials which have the acoustic velocity of transverse wave of at least about 5,000 m/second. In this case, since such dielectric materials have faster acoustic velocity of transverse wave than that of $SiO_2$, the SH type boundary acoustic wave can be reliably confined into the $SiO_2$ layer side.

As a dielectric material, a dielectric material selected from the group of silicon nitride (SiN), aluminum oxide ($Al_2O_3$), aluminum nitride (AlN), silicon (Si), silicon oxynitride (SiON) and diamond-like carbon (DLC), for example, can preferably be used. Thereby, the boundary acoustic wave can be reliably confined under the second dielectric layer.

Instead of the second dielectric layer 7, a laminated dielectric layer including one dielectric layer made of a material selected from the above described group and at least one dielectric layer made of another kind of dielectric material selected from the group, may preferably be used.

According to a preferred embodiment of the present invention, Ti films 11a, 11c, 11e and 11g are provided as adhesive layers to increase the adhesiveness between the electrode films and as a barrier layer to inhibit diffusion between the metals in the IDT electrode. Other than Ti, an adhesive layer made of NiCr or an adhesive layer and a barrier layer made of another metal, for example, may be disposed.

More preferably, the Ti film is laminated between the electrode film made of Pt and the electrode film made of Al, between the Pt film and the $LiNbO_3$, between the Al film and the $LiNbO_3$, between the Pt film and the $SiO_2$ layer, and between the Al film and the SiO$_2$ layer. Thereby, the reliability can be increased and the loss can be decreased due to low resistance.

In the boundary acoustic wave device according to a preferred embodiment of the present invention, the fact that the frequency characteristic is not deteriorated by changing the above described propagation angle ψ of LiNbO$_3$ is now explained with reference to FIG. 15.

As is well known, when a SiO$_2$ film is used in combination with LiNbO$_3$, an absolute value of frequency-temperature coefficient TCF becomes very small, thereby variations of the frequency-temperature characteristic by temperature is suppressed.

Figure 15:
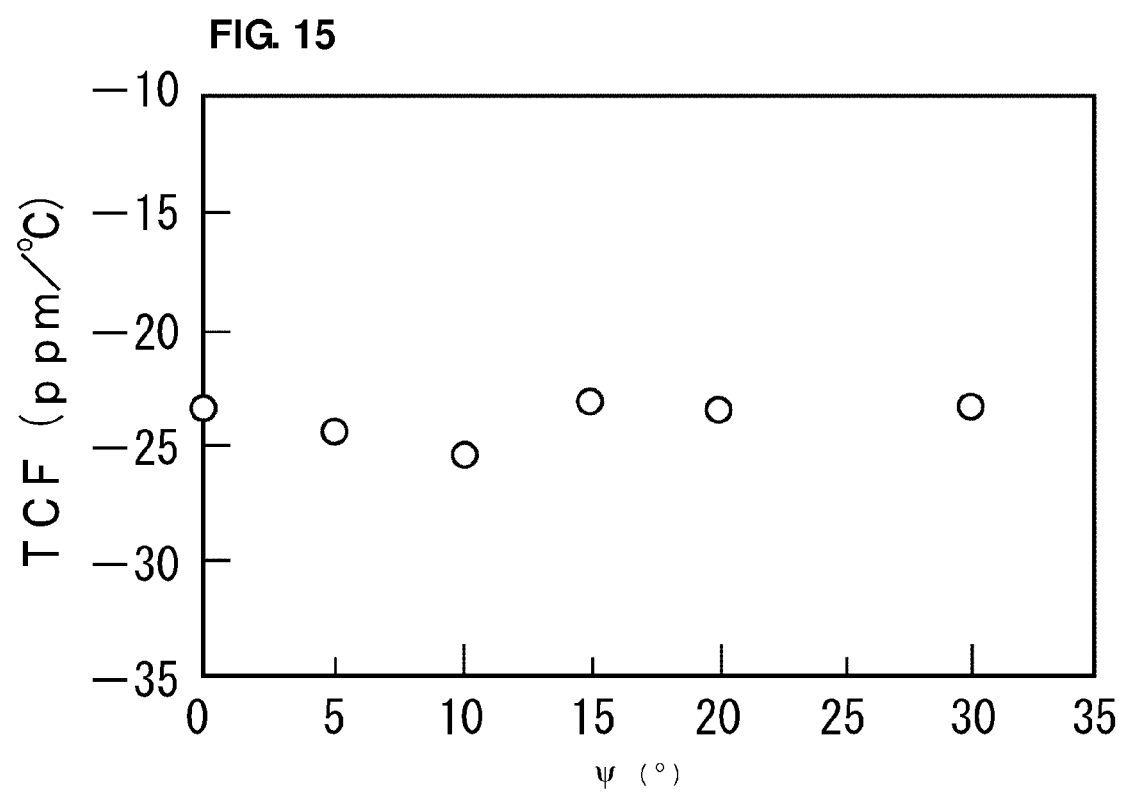
FIG. 15 shows a relationship of an Euler angle ψ of a $LiNbO_3$ substrate and a frequency-temperature coefficient TCF in a boundary acoustic wave device.

FIG. 15 shows the frequency-temperature coefficient TCF of the boundary acoustic wave device 1 according to a preferred embodiment of the present invention and the same of a boundary acoustic wave device with ψ=0° prepared for comparison. As shown in FIG. 15, the frequency-temperature coefficient TCF does not significantly vary in cases of ψ being about 5°, about 10°, about 15°, about 20°, and about 30° in accordance with the above described preferred embodiment as compared to the case of W=0°. Accordingly, without causing deterioration of the frequency-temperature characteristic, that is, while improving the frequency-temperature characteristic by providing the SiO$_2$ layer, the spurious response of the higher order mode can be suppressed in accordance with preferred embodiments of the present invention.

FIG. 16 to FIG. 21 show impedance characteristics and phase characteristics of boundary acoustic wave devices prepared for comparison with Euler angles (0°, 90°, 0°), (0°, 100°, 0°) and (0°, 127°, 0°).

Figure 16:
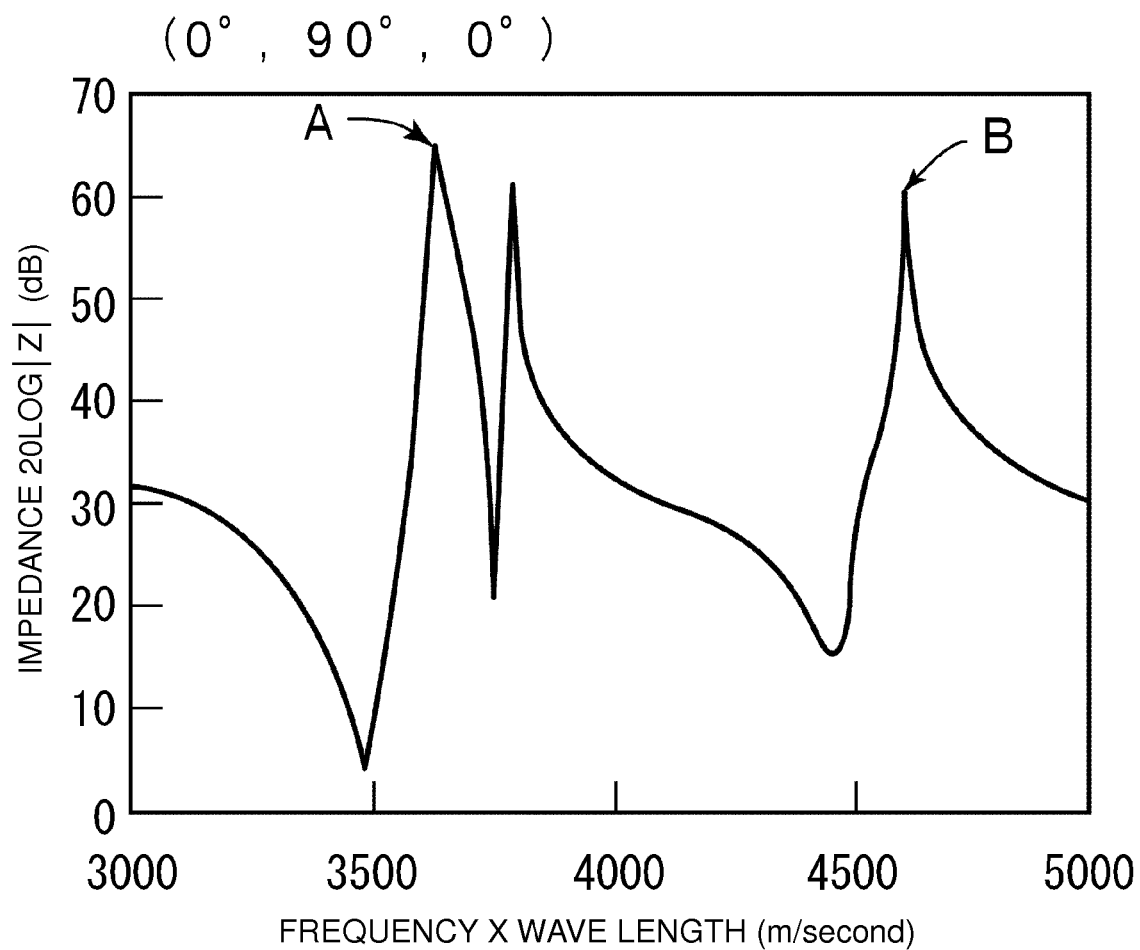
FIG. 16 shows an impedance characteristic of a boundary acoustic wave device including a $LiNbO_3$ substrate having Euler angles (0°, 90°, 0°).
Figure 17:
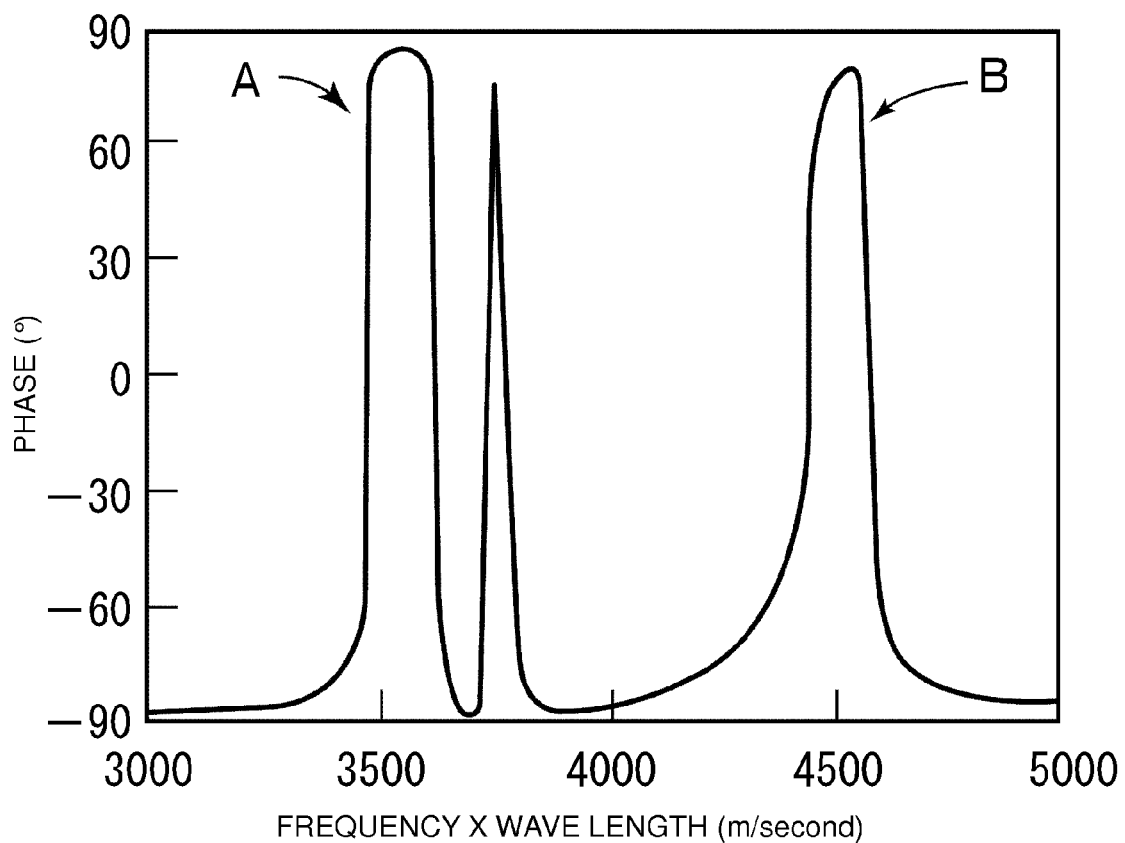
FIG. 17 shows a phase characteristic of a boundary acoustic wave device including a $LiNbO_3$ substrate having Euler angles (0°, 90°, 0°).
Figure 18:
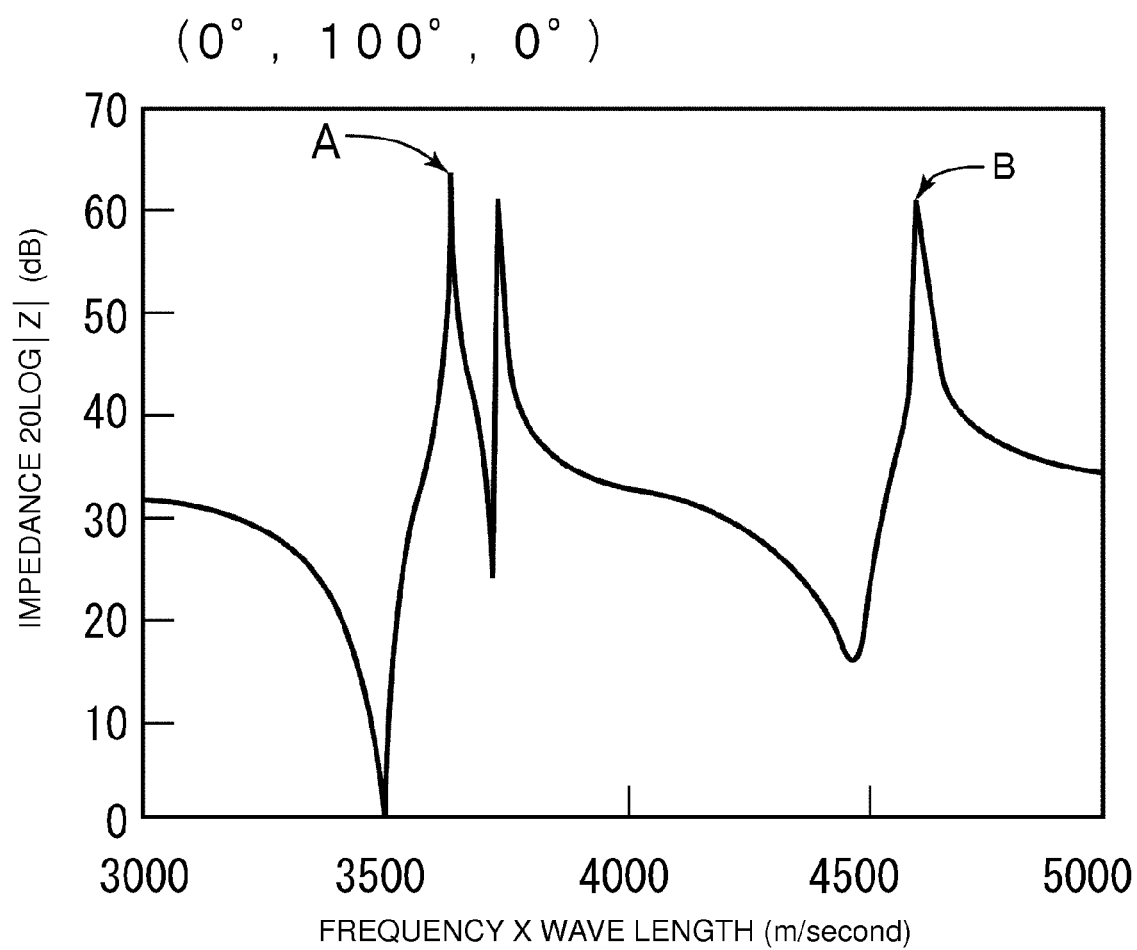
FIG. 18 shows an impedance characteristic of a boundary acoustic wave device including a LiNbO$_3$ substrate having Euler angles (0°, 100°, 0°).
Figure 19:
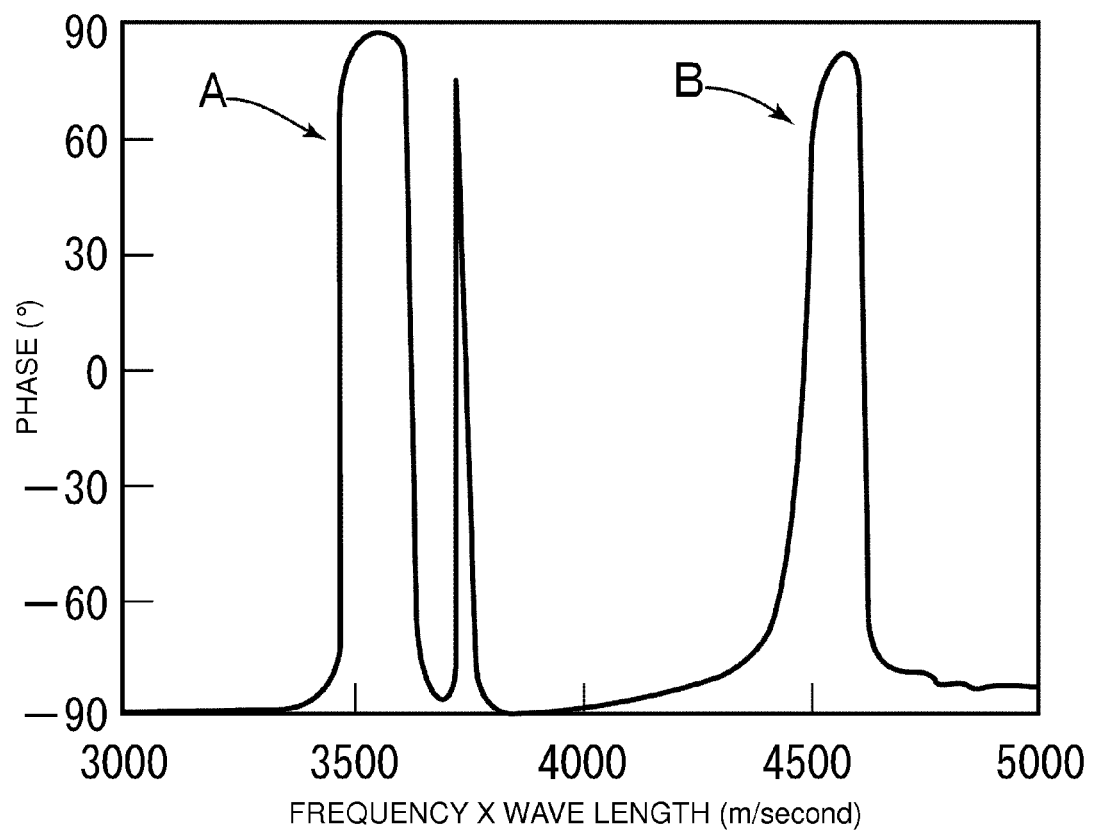
FIG. 19 shows a phase characteristic of a boundary acoustic wave device including a LiNbO$_3$ substrate having Euler angles (0°, 100°, 0°).
Figure 20:
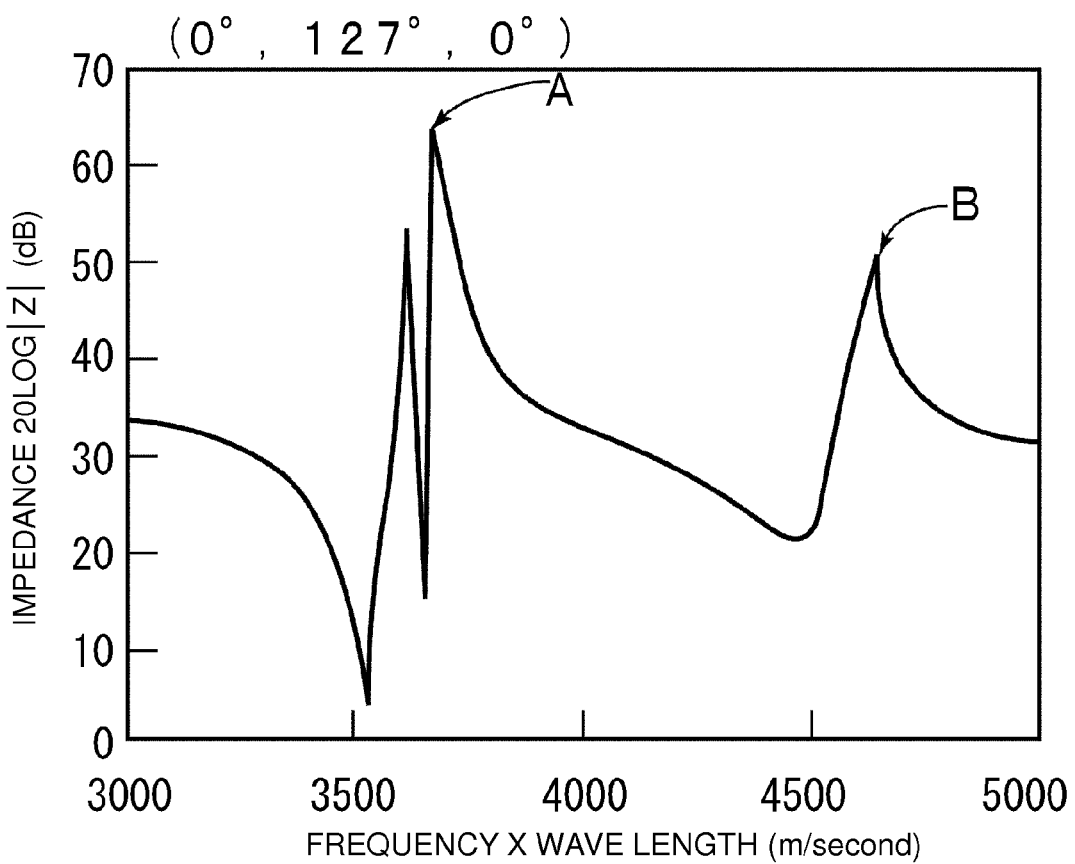
FIG. 20 shows an impedance characteristic of a boundary acoustic wave device including a LiNbO$_3$ substrate having Euler angles (0°, 127°, 0°).
Figure 21:
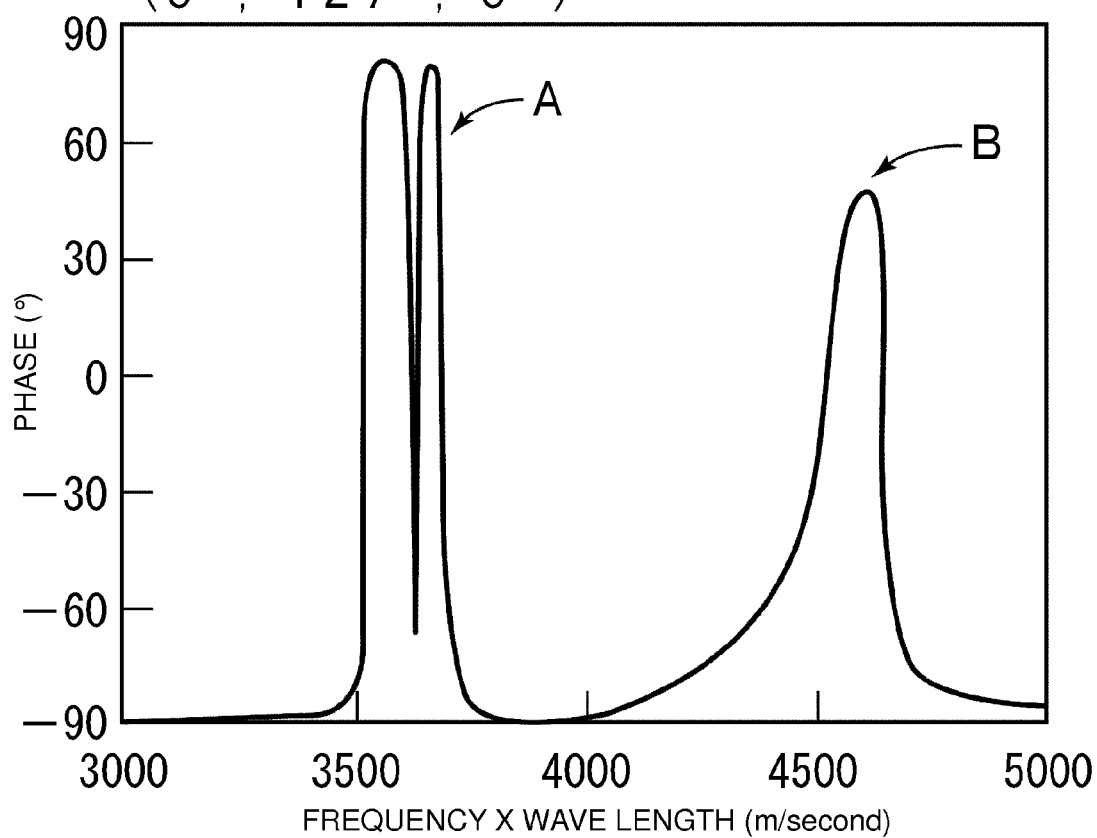
FIG. 21 shows a phase characteristic of a boundary acoustic wave device including a LiNbO$_3$ substrate having Euler angles (0°, 127°, 0°).

FIG. 16 and FIG. 17 show the result at θ=about 90°, FIG. 18 and FIG. 19 show the result at 8=about 100° and FIG. 20 and FIG. 21 show the result at 8=about 127° respectively.

In the graph, a response by the basic mode of an SH type boundary wave device is shown as A, and a response by the higher order mode is shown as B.

As shown in FIG. 16 to FIG. 21, in each case in which 8 of Euler angles is about 90°, about 100° or about 127°, an impedance ratio of the basic mode, that is a ratio of an impedance at the anti-resonant frequency to an impedance at the resonant frequency, is equal to or greater than about 60 dB, and therefore, similar to that of the above described preferred embodiment when θ=about 115°. Accordingly, when 8 of Euler angles is in the range about 90° to about 127°, the response by the basic mode becomes large enough similar to that of the above-described preferred embodiment. Further, there is a problem in that the spurious response of the higher order mode is large. Therefore, when θ of the Euler angles is in the range about 90° to about 127°, it is preferable to set ψ of Euler angles in the range of about 5° to about 30°. In this case, the spurious response of the higher order mode is suppressed and a relatively large response by the basic mode is obtained.

Although a boundary acoustic wave which is propagated by confining energy in the SiO$_2$ layer is preferably used in the preferred embodiment shown in FIG. 1A and FIG. 1B, an acoustic wave device according to preferred embodiments of the present invention may be a surface acoustic wave device which utilizes a surface acoustic wave.

Figure 22:
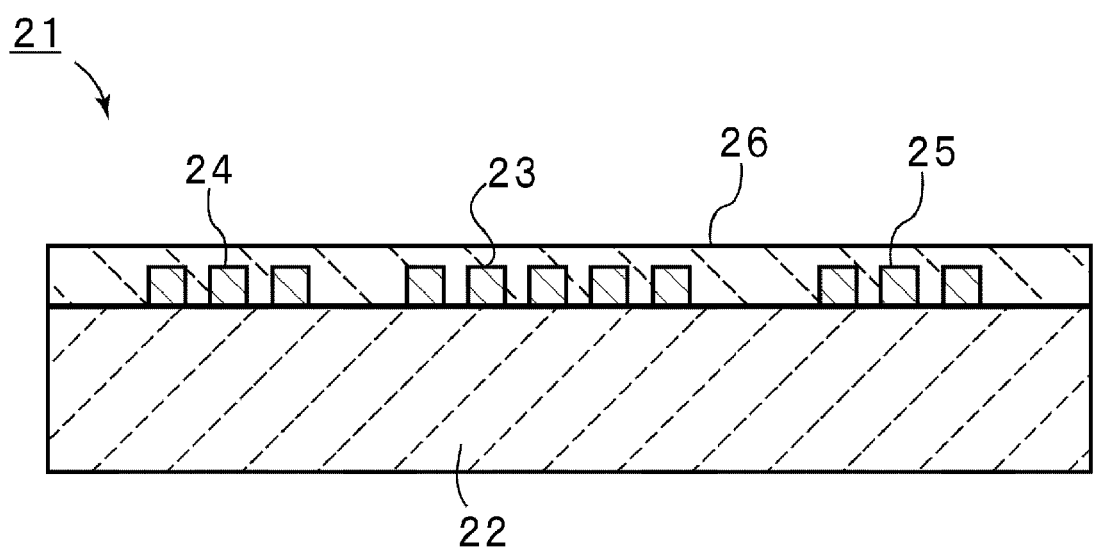
FIG. 22 is a schematic front cross-sectional view to explain a surface acoustic wave device according to another preferred embodiment of the present invention.

FIG. 22 is a schematic front cutaway view showing a surface acoustic wave device according to a second preferred embodiment of the present invention. In a surface acoustic wave device 21 of the second preferred embodiment of the present invention, an IDT electrode 23 is disposed on a piezoelectric substrate 22. A SiO$_2$ layer 26 is arranged such that it covers the IDT electrode 23. Here, the structure of the IDT electrode 23 is the same or substantially the same as the IDT electrode 3 shown in FIG. 1B. Reflectors 24 and 25 are disposed at two sides of the IDT electrode 23 in the surface acoustic wave propagating direction. Therefore, a one-port type surface acoustic wave device is provided.

In this preferred embodiment, the SiO$_2$ layer 26 is arranged such that it covers the IDT electrode 23 and the reflectors 24 and 25 and defines a film that improves the temperature characteristic. The SiO$_2$ layer 26 is provided to decrease the absolute value of frequency-temperature coefficient TCF and is not required to confine boundary acoustic wave. Therefore, the thickness of the SiO$_2$ film may preferably be in the range of about 0.16λ to about 0.30λ, where λ is the wavelength of a surface acoustic wave.

In this particular preferred embodiment, the metal material used for the IDT electrode 23 preferably includes a laminated Ti film, Cu film, and NiCr film, for example, in this order from upper side. In a similar manner as in previously described preferred embodiments, the IDT electrode 23 can be formed with other appropriate metal materials.

In this particular preferred embodiment as well, propagation angle ψ in Euler angles (φ, θ, ψ) of a piezoelectric substrate made of LiNbO$_3$ is set in the range of about 5° to about 30°, thereby the spurious response of the higher order mode is suppressed. This is shown in FIG. 23A and FIG. 23B.

In an experiment example, LiNbO$_3$ with Euler angles (0°, 86°, ψ) is used as the LiNbO$_3$ substrate, and a laminated metal film of Ti/Cu/NiCr with thickness 10 nm/90 nm/17 nm is used as the IDT electrode. The apodization ratio of the IDT electrode 23 is preferably substantially the same as that of the boundary acoustic wave device 1 in the previously described preferred embodiment. The wavelength λ is set to about 1.6 μm.

The film thickness of SiO$_2$ layer 26 is set to about 450 nm, that is, about 0.28λ. The reflectors 24 and 25 are grating reflectors, similar to those of the above described preferred embodiment.

Figure 23A:
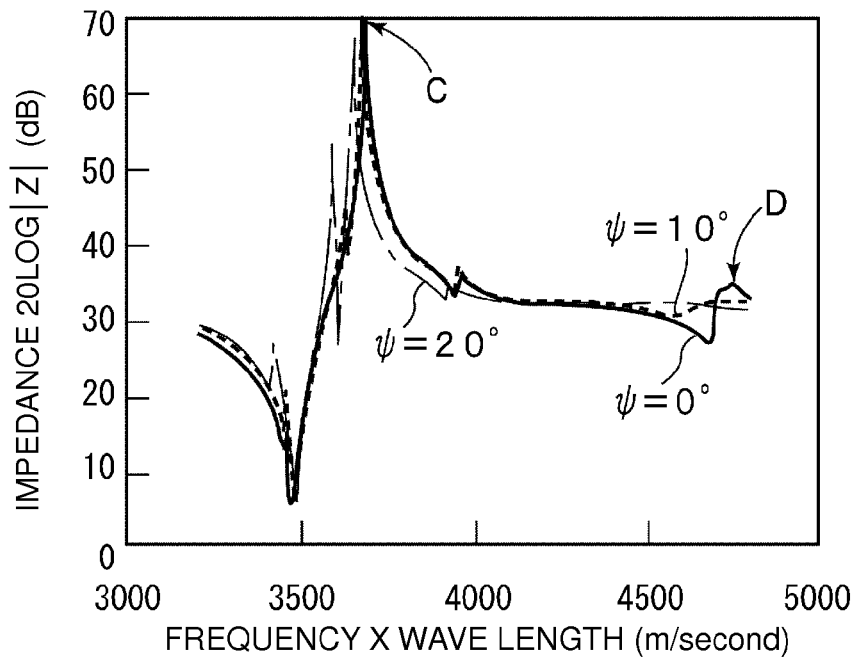
FIG. 23A shows a relationship of an impedance and ψ in a surface acoustic wave device according to a second preferred embodiment of the present invention which is including a LiNbO$_3$ substrate having Euler angles (0°, 86°, ψ)
Figure 23B:
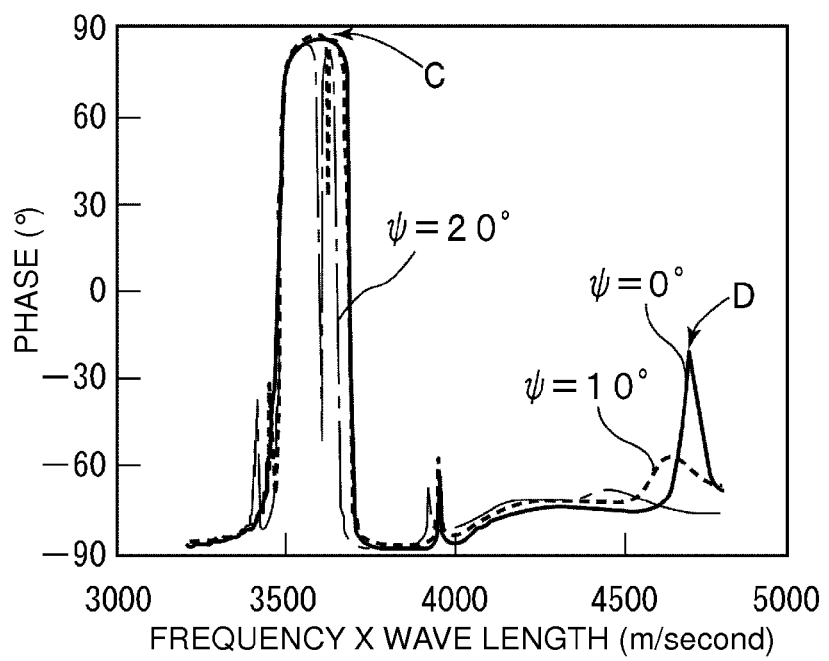
FIG. 23B shows a relationship of phase characteristics and ψ in a surface acoustic wave device according to a second preferred embodiment of the present invention which is including a LiNbO$_3$ substrate having Euler angles (0°, 86°, ψ).
Figure 24:
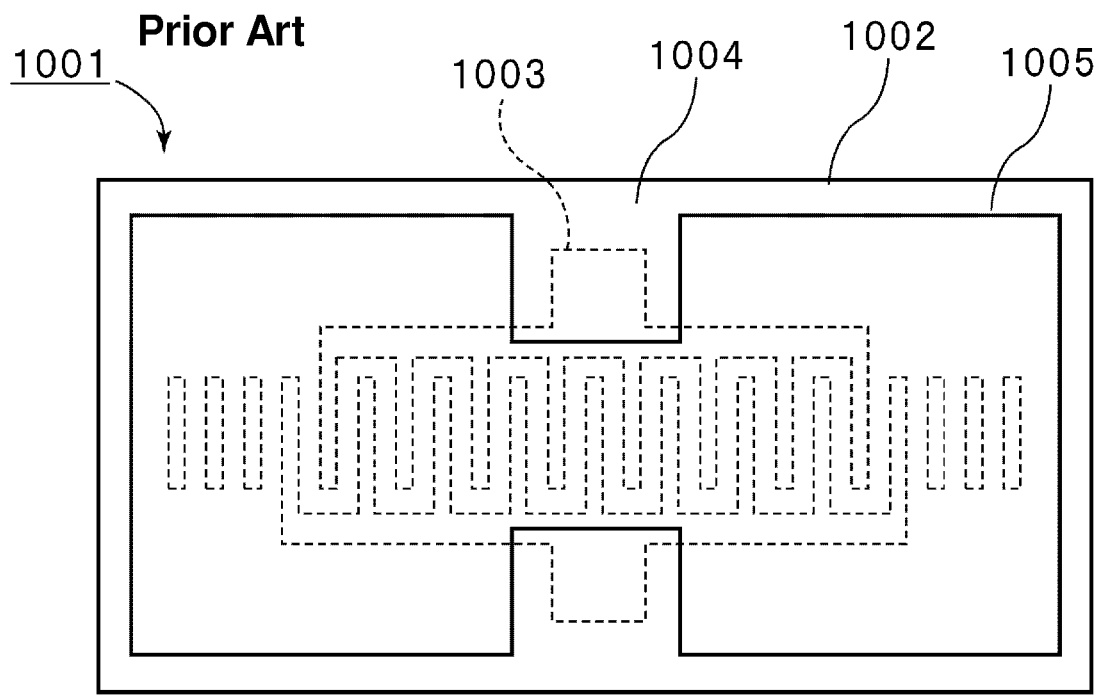
FIG. 24 is a schematic plan view of a conventional boundary acoustic wave device.
Figure 25:
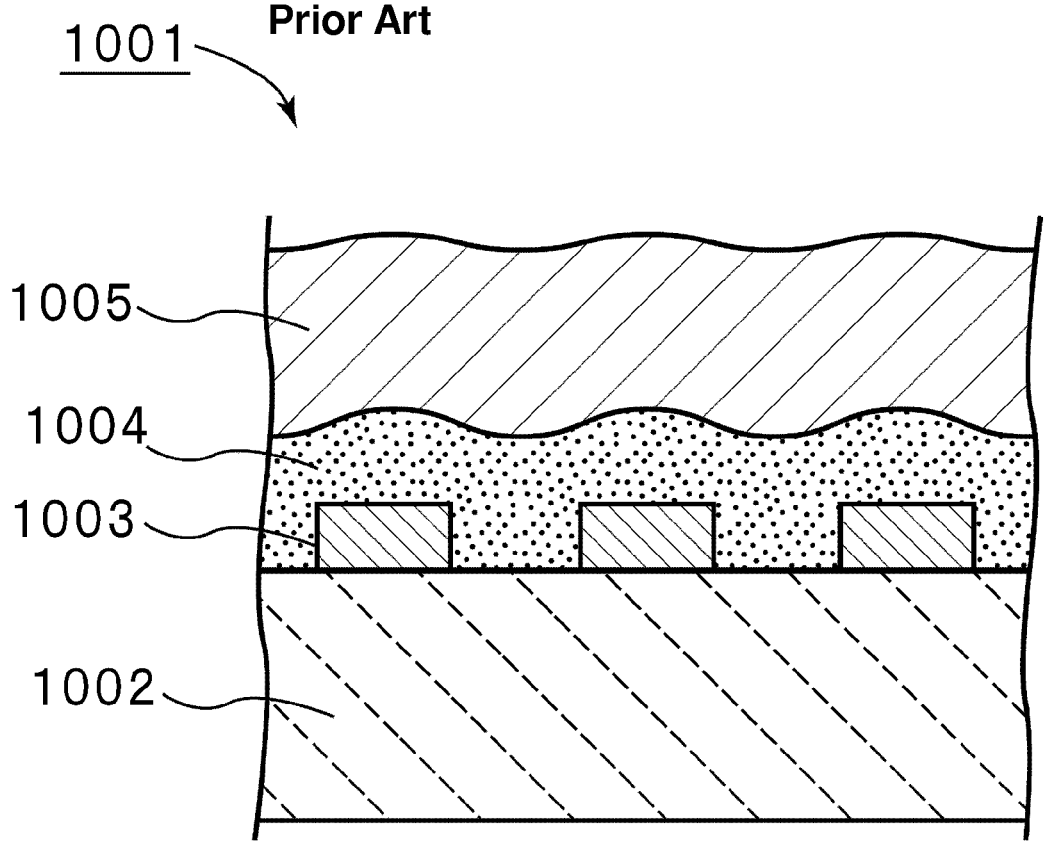
FIG. 25 is a partially cutaway enlarged front cross-sectional view showing a main portion of a conventional boundary acoustic wave device.

FIGS. 23A and 23B show the impedance characteristics and the phase characteristics of several kinds of surface acoustic wave device prepared as described above. The solid line shows a result in the case of ψ=about 0°, the broken line shows a result in the case of ψ=about 10° and the chain line shows a result in the case of ψ=about 20°.

As shown in FIGS. 23A and 23B, the response of the higher order mode which is indicated by arrow D is decreased significantly when the propagation angle ψ is about 10° and about 20° as compared to when ψ is about 0°. In addition, the response of a basic mode indicated by arrow C is not significantly deteriorated.

Accordingly, it is understood from FIGS. 23a and 23B that the spurious response can be suppressed by increasing the propagation angle ψ in the surface acoustic wave device.

According to experiments conducted by the inventor of the present application, the spurious response of the higher order mode was suppressed effectively as well by setting ψ in the range of about 5° to about 30°. Therefore, in the surface acoustic wave device as well, ψ is preferably set in the range of about 5° to about 30°.

In the surface acoustic wave device, the suppression effect on the spurious response of the higher order mode does not change significantly by changing θ of Euler angles within the range of about 80° to about 130°, similar to the case of boundary acoustic wave device. Meanwhile, in case of surface acoustic wave device, when θ is in the range of about 80° to about 90° in Euler angles (0°, θ, ψ), the response of an unwanted mode which appears near a response of an SH type surface acoustic wave can be suppressed.

For Euler angles ($\phi$, $\theta$, $\psi$) which express the cut surface of the substrate and the propagation direction of the boundary wave are referred to right-hand system Euler angles described in a literature "Acoustic Wave Device Technology Handbook" (edited by Acoustic Wave Device Technology 150th Committee of the Japan Society for the Promotion of Science, first print/first edition issued on Nov. 30, 2001, p. 549).

Namely, in crystal axes X, Y and Z of LiNbO$_3$, Xa axis is obtained by revolving X axis by $\phi$ in an anti-clockwise direction around Z axis.

Next, Z' axis is obtained by revolving Z axis by $\theta$ in an anti-clockwise direction around Xa axis.

The surface including Xa axis and having Z' axis as normal line is regarded as cut surface of the substrate.

Then, X' axis which is given by revolving Xa axis by $\psi$ in an anti-clockwise direction around Z' axis is regarded the propagation direction of the boundary wave.

In addition, as for crystal axes X, Y and Z of LiNbO$_3$ represented as the initial values of Euler angles, the Z axis is set parallel to the c-axis, the X axis is set parallel to any one of the three equivalent a-axes in three different directions, and Y axis is set to the normal line of a plane including the X axis and Z axis.

In addition to the Euler angles ($\phi$, $\theta$, $\psi$) of LiNbO$_3$ according to the above-described preferred embodiments of the present invention, Euler angles equivalent thereto from a crystallographic point of view may also used. Since LiNbO$_3$ is a trigonal crystal belonging to the 3 m point group, the following equation holds.

$$\begin{aligned} F(\phi, \theta, \psi) &= F(60° + \phi, -\theta, \psi) \\ &= F(60° - \phi, -\theta, 180° - \psi) \\ &= F(\phi, 180° + \theta, 180° - \psi) \\ &= F(\phi, \theta, 180° + \psi) \end{aligned}$$

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave device comprising:
   a piezoelectric substrate made of LiNbO$_3$;
   a dielectric layer laminated on the piezoelectric substrate;
   an IDT electrode disposed at an interface of the piezoelectric substrate and the dielectric layer, $\phi$ and $\theta$ of Euler angles expressed by ($\phi$, $\theta$, $\psi$) of LiNbO$_3$ substrate satisfying $\phi$=about 0° and 80°$\leq\theta\leq$130° respectively, the acoustic wave device using an acoustic wave primarily having an SH wave; wherein
   $\psi$ is set to satisfy 5°$\leq\psi\leq$30°;
   the dielectric layer is SiO$_2$;
   the acoustic wave device is a surface acoustic wave device that utilizes an SH type surface acoustic wave as an acoustic wave; and
   $\theta$ of the Euler angles of LiNbO$_3$ is in the range of 80°$\leq\theta\leq$90°.

2. An acoustic wave device according to claim 1, further comprising a second dielectric layer which is laminated on the SiO$_2$ layer.

3. An acoustic wave device according to claim 2, wherein the second dielectric layer is a dielectric material selected from the group consisting of silicon, silicon nitride, aluminum oxide, aluminum nitride, silicon oxynitride, and diamond-like carbon having a slow transverse wave acoustic velocity equal to or greater than about 5000 m/second.

4. An acoustic wave device according to claim 1, wherein the IDT electrode includes an electrode film including a metal selected from the group consisting of Au, Ag, Cu, Pt, Ta, W, Ni, Fe, Cr, Mo, Ti and an alloy including one of these metals as a main component, or a laminated film including the electrode film and a second electrode film composed of a different metal from that of the first electrode film.

5. An acoustic wave device according to claim 4, wherein the laminated film includes a plurality of electrode films which are made of Pt, Al or an alloy of these metals as main components.

* * * * *